US 8,130,575 B2

(12) United States Patent
Hanzawa et al.

(10) Patent No.: US 8,130,575 B2
(45) Date of Patent: Mar. 6, 2012

(54) SEMICONDUCTOR DEVICE

(75) Inventors: Satoru Hanzawa, Hachioji (JP); Hitoshi Kume, Musashino (JP); Motoyasu Terao, Hinode (JP); Tomonori Sekiguchi, Tama (JP); Makoto Saen, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/207,611

(22) Filed: Aug. 11, 2011

(65) Prior Publication Data

US 2011/0292722 A1    Dec. 1, 2011

Related U.S. Application Data

(63) Continuation of application No. 13/008,893, filed on Jan. 18, 2011, which is a continuation of application No. 12/427,392, filed on Apr. 21, 2009, now Pat. No. 7,894,232.

(30) Foreign Application Priority Data

Apr. 22, 2008    (JP) .................................. 2008-110839

(51) Int. Cl.
*G11C 7/00* (2006.01)
*G11C 11/00* (2006.01)
(52) U.S. Cl. ...................... 365/201; 365/163; 365/200
(58) Field of Classification Search ............... 365/201
See application file for complete search history.

(56) References Cited

U.S. PATENT DOCUMENTS

| 3,897,626 | A | 8/1975 | Beausoleil |
| 5,987,623 | A | 11/1999 | Ushida |
| 6,138,255 | A | 10/2000 | Noji |
| 6,556,504 | B2 * | 4/2003 | Kwon et al. ............. 365/230.08 |
| 6,573,567 | B1 | 6/2003 | Nishizawa et al. |
| 6,586,823 | B2 | 7/2003 | Ohmura et al. |
| 6,711,042 | B2 | 3/2004 | Ishikawa |
| 6,724,668 | B2 | 4/2004 | Ohmura et al. |
| 6,917,547 | B2 | 7/2005 | Kanamori et al. |
| 6,925,018 | B2 | 8/2005 | Tatsumi |
| 6,988,232 | B2 | 1/2006 | Ricchetti et al. |

(Continued)

FOREIGN PATENT DOCUMENTS

JP    2003-257194 A    9/2003

(Continued)

OTHER PUBLICATIONS

Kwang-Jin Lee et al. "A 90nm 1.8V 512Mb Diode-Switch PRAM with 266MB/s Read Throughput", IEEE International Solid-State Circuits Conference, Digest of Technical Papers, USA, 2007, pp. 472-473.

(Continued)

*Primary Examiner* — Son Mai
(74) *Attorney, Agent, or Firm* — Miles & Stockbridge P.C.

(57) ABSTRACT

A highly reliable large capacity phase change memory module is realized. A semiconductor device according to the present invention includes a memory array having a structure in which a storage layer using a chalcogenide material and a memory cell constituted of a diode are stacked, and an initialization condition and a rewriting condition are changed in accordance with the layer where a selected memory cell is located. A current mirror circuit is selected in accordance with an operation, and at the same time, the initialization condition and the rewriting condition (here, reset condition) are changed in accordance with the operation by a control mechanism of the reset current in a voltage selection circuit and a current mirror circuit.

4 Claims, 25 Drawing Sheets

U.S. PATENT DOCUMENTS

| | | |
|---|---|---|
| 7,053,470 B1 | 5/2006 | Sellers et al. |
| 7,054,705 B2 | 5/2006 | Ogawa et al. |
| 7,315,969 B2 | 1/2008 | Jakobs |
| 7,321,436 B2 | 1/2008 | Asauchi |
| 7,477,545 B2 | 1/2009 | Tu et al. |
| 7,619,936 B2 | 11/2009 | Philipp et al. |
| 7,631,238 B2 | 12/2009 | Jung |
| 7,702,831 B2 * | 4/2010 | Ma et al. ............ 710/74 |
| 7,778,057 B2 | 8/2010 | McCarthy et al. |
| 7,793,174 B2 | 9/2010 | Hattori et al. |
| 7,804,718 B2 * | 9/2010 | Kim ............ 365/185.29 |
| 7,872,936 B2 | 1/2011 | Blankenship |
| 7,877,649 B2 | 1/2011 | Kliewer et al. |
| 8,004,898 B2 * | 8/2011 | Park et al. ............ 365/185.12 |
| 8,040,713 B2 * | 10/2011 | Chen et al. ............ 365/148 |
| 2001/0045645 A1 | 11/2001 | Sasaki et al. |
| 2002/0004878 A1 | 1/2002 | Norman |
| 2002/0061606 A1 | 5/2002 | Honma et al. |
| 2002/0105854 A1 | 8/2002 | Huh et al. |
| 2003/0164510 A1 | 9/2003 | Dono |
| 2006/0044896 A1 | 3/2006 | Taussig et al. |
| 2007/0168781 A1 | 7/2007 | Sutardja et al. |
| 2007/0283428 A1 * | 12/2007 | Ma et al. ............ 726/9 |
| 2008/0002493 A1 | 1/2008 | Kim et al. |
| 2008/0052573 A1 | 2/2008 | Pekny |
| 2008/0106958 A1 | 5/2008 | Kwon et al. |

FOREIGN PATENT DOCUMENTS

| | | |
|---|---|---|
| KR | 0180280 B2 | 3/1999 |
| KR | 2002-0065767 A | 8/2002 |

OTHER PUBLICATIONS

T. Morikawa et al., "Doped In-Ge-Te Phase Change Memory Featuring Stable Operation and Good Data Retention", IEEE International Electron Device Meeting, Digest of Technical Papers, USA, 2007, pp. 307-310.

* cited by examiner

FIG. 8

| DEVICE ID | BLOCK ADDRESS | STATE |
|---|---|---|
| ... | ... | ... |
| $n$ | 0 | Good |
| $n$ | 1 | Good |
| ... | ... | ... |
| $n$ | $j-1$ | Good |
| $n$ | $j$ | Bad |
| $n$ | $j+1$ | Good |
| ... | ... | ... |
| $n$ | 2047 | Good |
| $n+1$ | 0 | Good |
| $n+1$ | 1 | Good |
| ... | ... | ... |
| $n+1$ | $k-1$ | Good |
| $n+1$ | $k$ | Bad |
| $n+1$ | $k+1$ | Good |
| ... | ... | ... |
| $n+1$ | 2047 | Good |
| ... | ... | ... |

| DEVICE ID | BAD BLOCK ADDRESS |
|---|---|
| ... | ... |
| n | j |
| n+1 | k |
| ... | ... |

FIG. 24
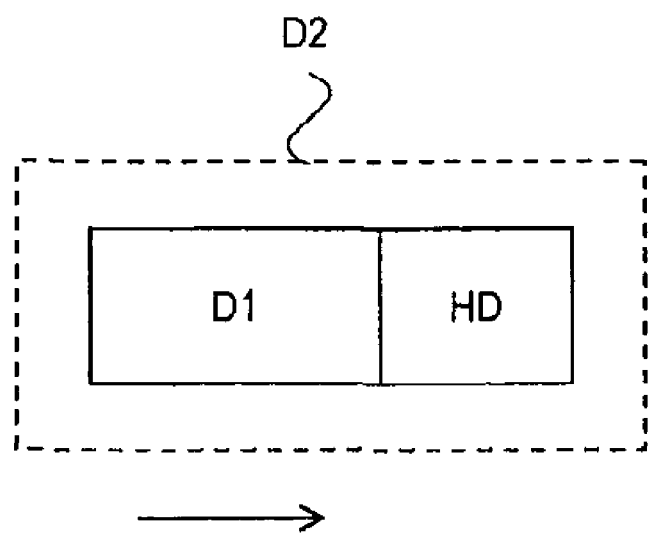
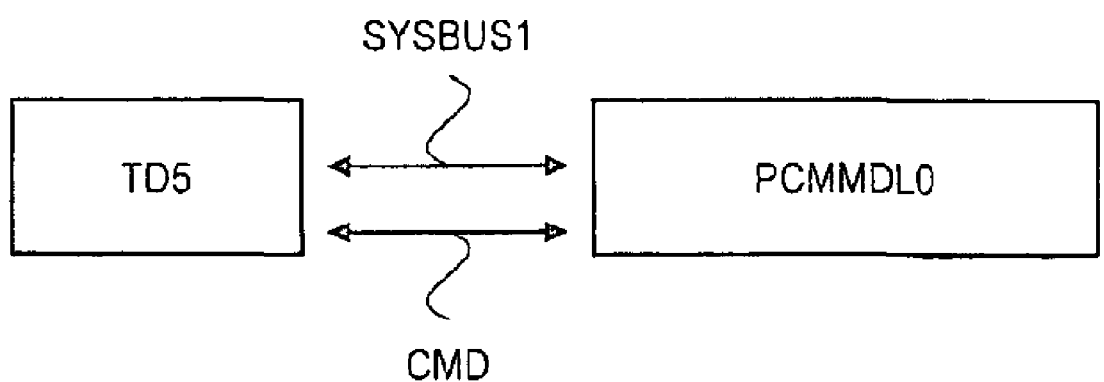

SEMICONDUCTOR DEVICE

CROSS-REFERENCE TO RELATED APPLICATION

This application is a continuation of application Ser. No. 13/008,893 filed Jan. 18, 2011, which is a continuation of application Ser. No. 12/427,392 filed Apr. 21, 2009 (now U.S. Pat. No. 7,894,232). The present application also claims priority from Japanese Patent Application No. JP 2008-110839 filed on Apr. 22, 2008, the content of which is hereby incorporated by reference into this application.

TECHNICAL FIELD OF THE INVENTION

The present invention relates to a semiconductor device, and more particularly to a technique effectively applied to a storage device including a memory cell composed of an element whose resistance value varies in accordance with stored information, in particular, a storage device including a phase change memory using a memory cell which stores information by using a change in state of a chalcogenide material and discriminates the information by detecting difference of resistance values in accordance with a state of a chalcogenide material.

BACKGROUND OF THE INVENTION

As a technique examined by the present inventors, for example, the following technique is conceivable in a semiconductor device including a phase change memory. A storage element uses a Ge—Sb—Te based or Ag—In—Sb—Te based chalcogenide material (or phase change material) containing at least antimony (Sb) and tellurium (Te) as a material of a storage layer. Further, a diode is used as a selection element. The array configuration of a phase change memory using a chalcogenide material and a diode is described in, for example, "IEEE International Solid-State Circuits Conference, Digest of Technical Papers", USA, 2007, pp. 472-473 (Non-Patent Document 1).

FIG. 2 is a view extracting a local memory-cell array LCA from the memory core configuration described in FIG. 26.1.2 of the Non-Patent Document 1. Memory cells MC00 to MCnn in which a resistive storage device R using a phase change material and a diode for select D are connected in series are disposed at intersections of (n+1) local bit-lines LBL0 to LBLn and (n+1) word lines WL0 to WLn. Each of the local bit-lines LBL0 to LBLn is connected to a global bit-line GBL0 through NMOS transistors MNYS0 to MNYSn. The transistors MNYS0 to MNYSn are controlled by local column select signals LY0 to LYn connected to the respective gate electrodes thereof. More specifically, when any one of the transistors NMYS0 to MNYSn is activated and made conductive, any one of the local bit-lines LBL0 to LBLn is electrically connected to the global bit-line GBL0. Note that NMOS transistors MND0 to MNDn are inserted between the local bit-lines LBL0 to LBLn and ground terminals VSS, respectively. The transistors MND0 to MNDn are controlled by a local bit-line discharge signal LBLDIS connected to respective gate electrodes thereof.

"IEEE International Electron Device Meeting, Digest of Technical Papers", USA, 2007, pp.307-310 (Non-Patent Document 2) describes temperature conditions capable of retaining the stored information for ten years. According to the Non-Patent Document 2, by adding indium (In) to a chalcogenide material, the operable temperature range from 85° C. to 105° C. is expanded up to 150° C. Since the operable temperature range is expanded, the application range of the phase change memory is expanded.

SUMMARY OF THE INVENTION

Before filing the present application, the present inventors have studied a technique for increasing the capacity of a phase change memory using a storage layer made of a chalcogenide material and a diode. In particular, they have studied the application of the architecture referred to as a Mostly Good Memory system which is adapted in a NAND flash memory to a phase change memory. At the beginning, the Mostly Good Memory system will be briefly described below.

The Mostly Good Memory system is a system in which a chip vendor conducts an inspection of a memory chip, and the memory chip is packaged and shipped with the information as to whether the corresponding field is valid or invalid being recorded for each arbitrary field. Here, the arbitrary field is a field in which an erasing operation is performed, that is, a block. For example, an 8-Gigabit NAND flash memory has 2048 blocks and is selected by an 11-bit block address signal BA [16:6] as shown in FIG. 3. Each block is constituted of 64 pages and is selected by a 6-bit page address signal PA [5:0]. Each of these pages is constituted of a main field MFD with 2K bytes to which storage information in written and a spare field SFD with 64 bytes to which the check bit of an error correction code and the like are written. It is possible to access the bit inside each page in units of byte by using a 12-bit column address signal CA [11:0]. Consequently, the memory capacity of each block is 132K bytes (–128K bytes+4K bytes). The chip vendor writes field information (hereinafter, referred to as block information) in a spare field formed by a memory cell having the same shape as a main field, more specifically, in the field selected by a column address 2048 of first and second pages. An end user confirms such field information at the activation of the system, thereby abandoning an invalid field (hereinafter, referred to as bad block) and using a valid field (hereinafter, referred to as good block) only.

FIG. 4 specifically shows a confirmation procedure of an invalid block due to an initial defect at the time of manufacture. While incrementing an address signal BA for selecting a block in sequence, the information written in the spare field selected by the column address 2048 of the first and second pages is read, thereby confirming a state of the block. When the information indicating invalidity (here, all 2 bytes are data '0') has been written, the fact is written in an initial invalid block table. During system operation, an access is selectively made to the bits of the good block while referencing this block table.

By the Mostly Good Memory system for performing such bad block confirmation and selective memory access, the end user can use the phase change memory including a defect bit without false operation. Further, by writing the field information in the spare field formed by a small-area memory cell having the same shape as a main field, the chip vendor can stably supply a highly integrated large capacity NAND flash memory. Further, the module vendor can supply a highly integrated and highly reliable large capacity NAND flash memory module.

However, as a result of the study of the application of the Mostly Good Memory system to the phase change memory using a resistive storage device constituted of a chalcogenide material, the following problems have been found. That is, in the reflow soldering performed by a client to modularize the phase change memory, the phase change memory is exposed to a state of 200° C. or higher, and there is the possibility that the block information is lost by such thermal load. When the block information is lost, since the end user is unable to recognize a bad block including the defect bit, there is a risk of inviting a false operation of the system. Even if the block information is to be stored by using the flash memory excellent in heat resistance, since additional steps are required in the manufacturing process of the flash memory, the manufacturing cost is increased. Further, when an optical fuse using a poly-silicon resistance is applied, the number of fuses is increased with the increase of the capacity of the phase change memory, so that memory cell occupancy is lowered. Consequently, the block information of the phase change memory is preferably written after the reflow soldering.

Such problems concerning the thermal load in the manufacturing process are not limited to the phase change memory, but are assumed also in other elements for retaining the storage information by resistance values such as a solid electrolyte memory, a ReRAM (Resistive Random Access Memory), a MRAM (Magnetoresistive Random Access Memory) and others.

Hence, in view of such problems, an object of the present invention is to provide a manufacturing method of a non-volatile memory module in which block information is written after the manufacturing step applying the thermal load, in a non-volatile memory for retaining the storage information by the resistance values. The above object and novel features of the present invention will be apparent from the description of the present specification and the accompanying drawings.

The typical ones of the inventions disclosed in this application will be briefly described as follows.

It is a manufacturing method of a non-volatile memory module, comprising: a first step of mounting a plurality of non-volatile memory chips constituted of a plurality of first memory cells and having first and second fields on a printed wiring board, thereby forming a non-volatile memory module; and a second step of writing first information, which is defect bit information of the plurality of first memory cells in the first field, in the second field after the first step.

Alternatively, it is a manufacturing method of a non-volatile memory, comprising: a first step of performing an inspection for extracting a position of a defect bit for each of a plurality of non-volatile memory chips having first and second fields constituted of a plurality of first memory cells and a third field constituted of a second memory cell; a second step of saving a result of the inspection written in the second field at the time of mounting the non-volatile memory chips on a printed wiring board in a storage medium outside the plurality of nonvolatile memories; and a third step of writing a device ID in the third field with respect to each of the plurality of memory cells.

Furthermore, it is a non-volatile memory having a plurality of memory cells, comprising: a first field which is constituted of a plurality of first memory cells having a first storage element and stores first information supplied from outside of the non-volatile memory; a second field which is constituted of the plurality of first memory cells and stores second information which is defect bit information of the plurality of first memory cells in the first field; and a third field which is constituted of a plurality of second memory cells having a second storage element and stores third information which is a plurality of device IDs in the first field, wherein a temperature up to which the second storage element can retain stored information is higher than a temperature up to which the first storage element can retain stored information.

The effects obtained by typical embodiments of the inventions disclosed in this application will be briefly described below. That is, a highly reliable large capacity non-volatile memory can be realized.

BRIEF DESCRIPTION OF THE DRAWINGS

FIG. 8 is a view showing an example of a content of an inspection result of the non-volatile memory constituted of the memory array shown in FIG. 1 in the manufacturing method of a phase change memory module according to the first embodiment of the present invention;

FIG. 24 is a view showing an example of an inspection and a block information writing system in the module vendor in the manufacturing method of a phase change memory module according to the sixth embodiment of the present invention;

DESCRIPTIONS OF THE PREFERRED EMBODIMENTS

Hereinafter, embodiments of the present invention will be described in detail with reference to the accompanying drawings. Note that components having the same function are denoted by the same reference numbers throughout the drawings for describing the embodiments, and the repetitive description thereof will be omitted. Although a circuit element constituting each functional block of the embodiments is not particularly limited, it is formed on a semiconductor substrate such as a single-crystal silicon substrate by a known integrated circuit technology such as that of a CMOS (complementary metal-oxide semiconductor transistor).

In the embodiments below, a MOS (Metal Oxide Semiconductor) transistor is used as one example of a MISFET (Metal Insulator Semiconductor Field Effect Transistor). In the figures, a P channel MOS transistor (PMOS transistor) is inscribed with a symbol of an arrow mark on the gate, so that it is distinguished from a N channel MOS transistor (NMOS transistor). Although the connection of the substrate potential of the MOS transistor is not particularly described in the figures, its connection method is not particularly limited as long as the MOS transistor can normally operate.

First Embodiment

The present embodiment provides a manufacturing method of a module having a phase change memory using a chalcogenide material as a storage element. Specifically, in the present manufacturing method, a memory is inspected and then modularized by performing reflow soldering, and thereafter, the block information based on the previous inspection result is written in a redundant area (here, the spare field shown in FIG. 3) constituted of the same memory cell as the data storage area (here, the main field shown in FIG. 3).

<<Configuration of Memory Array>>

Figure 1:
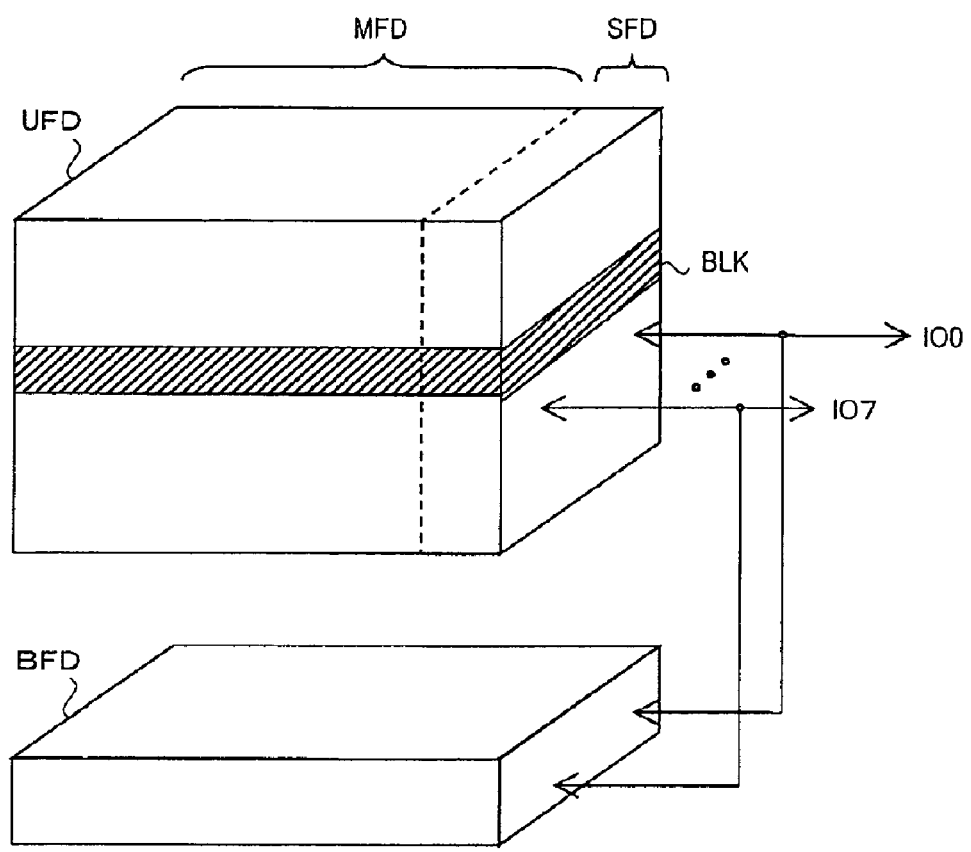
FIG. 1 is a view showing a configuration example of the array of a phase change memory using a resistive storage device included in a phase change memory module in a manufacturing method of a phase change memory module according to the first embodiment of the present invention.
Figure 2:
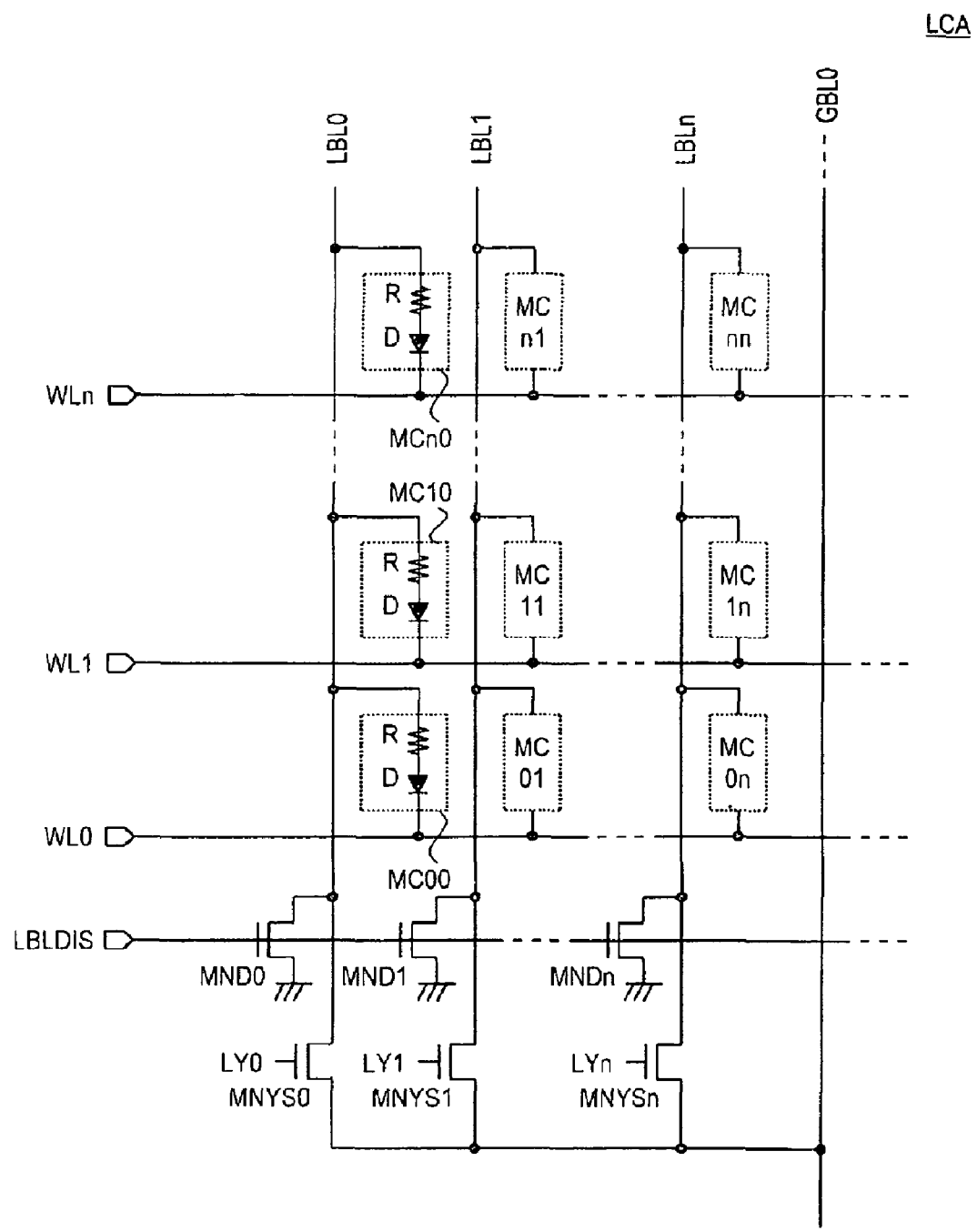
FIG. 2 is a view showing the array configuration of a non-volatile memory constituted of the resistive storage device using a phase change material.
Figure 3:
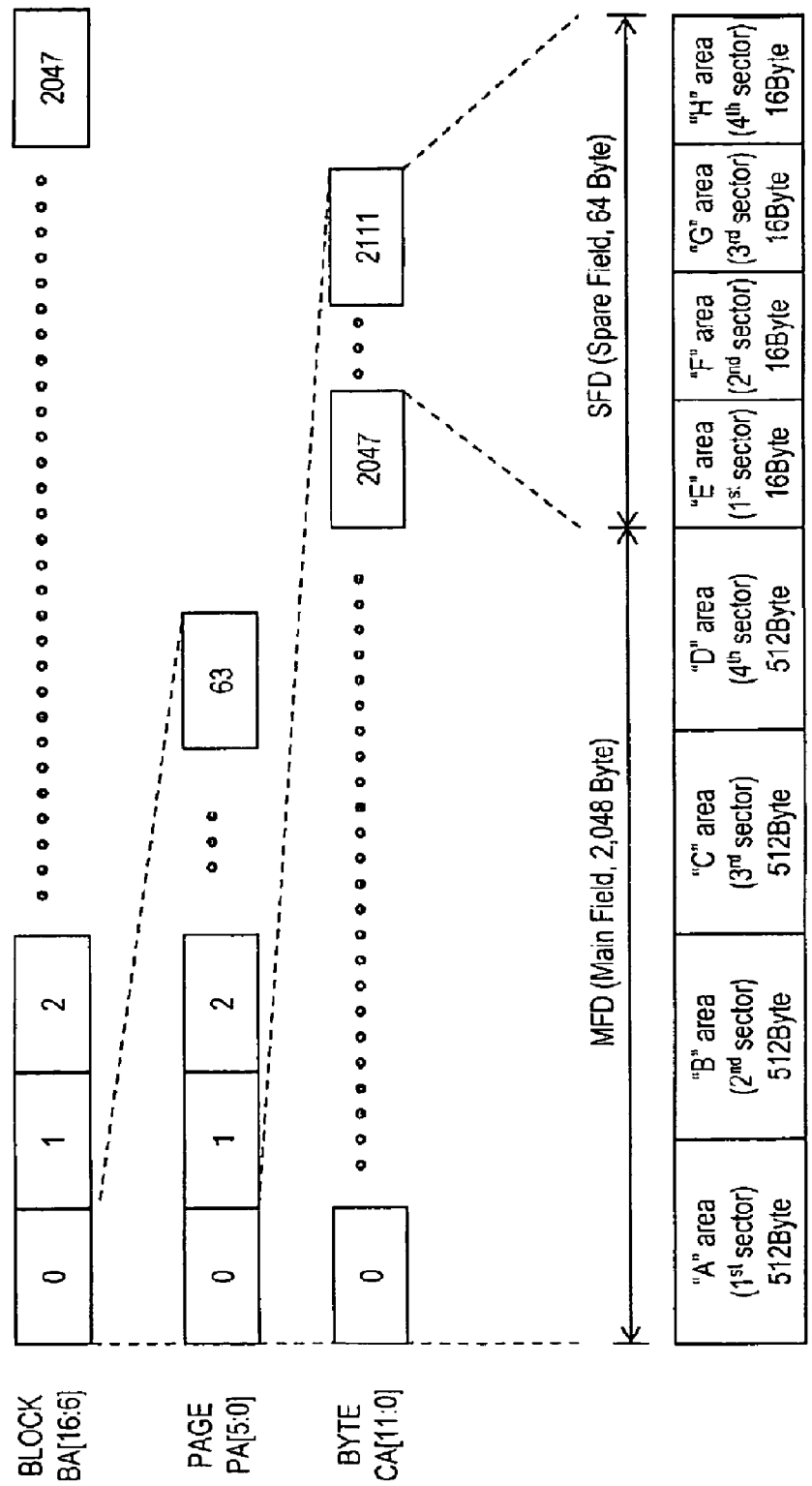
FIG. 3 is a view showing an example of the memory map in a NAND flash memory.
Figure 4:
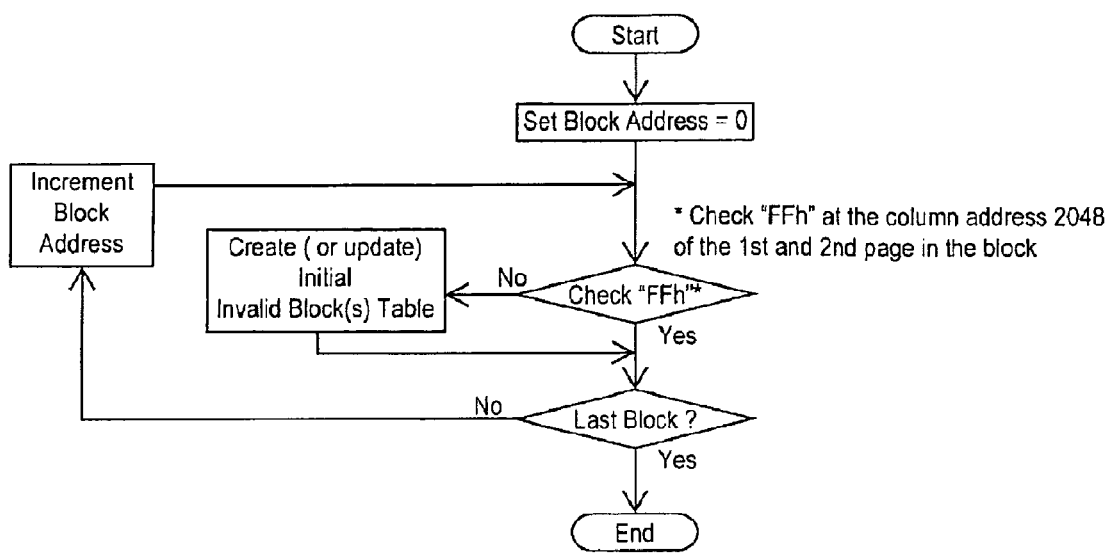
FIG. 4 is a view showing an example of a flow for creating an initial invalid block table in the NAND flash memory.

First, an array configuration of a phase change memory and a manufacturing method of a module using the phase change memory in the present embodiment will be described. FIG. 1 is a view showing a configuration example of the array of the phase change memory using a resistive storage device included in a semiconductor device of the first embodiment according to the present invention. The phase change memory array is constituted of two fields of a user field UFD and a vendor field BFD. The user field UFD is configured such that memory cells constituted of a storage layer made of a chalcogenide material and a diode for call selection are disposed in an array as shown in FIG. 2. As shown in FIG. 3, a block BLK is formed by using a plurality of pages composed of the main field MFD and the spare field SFD. The user field UFD exchanges the stored information with an external device through eight input/output lines IO0 to IO7. On the other hand, the vendor field BFD is constituted of a memory cell capable of retaining the stored information even when the thermal load of 200° C. or higher is applied at the time of the reflow soldering. This memory cell is constituted of, for example, a floating-gate or charge-trap flash memory cell, a fuse using the breaking of a poly-silicon wiring or dielectric breakdown of a gate oxide film, and the like. The vendor field BFD also exchanges the stored information with the external device through the eight input/output lines IO0 to IO7 like the user field UFD.

Here, the main field MFD is a field for storing the information from the external device. Further, the spare field is a field for writing bad block information concerning the memory cell of the main field MFD, and the vendor field is a field for writing a device ID of the memory chip.

The above-described configuration of the memory array has the following features.

The first feature is that the spare field SFD in which the bad block information is written is constituted of a phase change memory which is the same element as the main field MFD. Hence, as compared with the case where the spare field SFD is constituted of a flash memory, the bad block information can be stored without increasing the manufacturing cost. Further, as compared with the case of using the optical fuse using poly-silicon, the advantage is achieved in that the bad block information can be stored without lowering the memory cell occupancy.

The second feature is that the vendor field BFD which is the field in which the device ID of the memory chip is written is constituted of an element capable of retaining the stored information even when the thermal load in the manufacturing process is applied thereto. By the feature of the element, the device ID can be retained even if the thermal load is applied during the manufacturing process, so that a loss of the information of the device ID due to the thermal load can be prevented. As described above, by constituting the main field MFD and the spare field SFD of the same storage element and constituting the vendor field of the element capable of retaining the stored information up to the higher temperature than those of the main field and the spare field, since it is not necessary to use an element capable of retaining the stored information up to the high temperature for the spare field, the reduction of the area of the element and the simplification of the manufacturing process can be achieved.

A method of writing the bad block information in the spare field SFD based on the device ID will be described later.

<<Manufacturing Process of Memory Module>>

Figure 5:
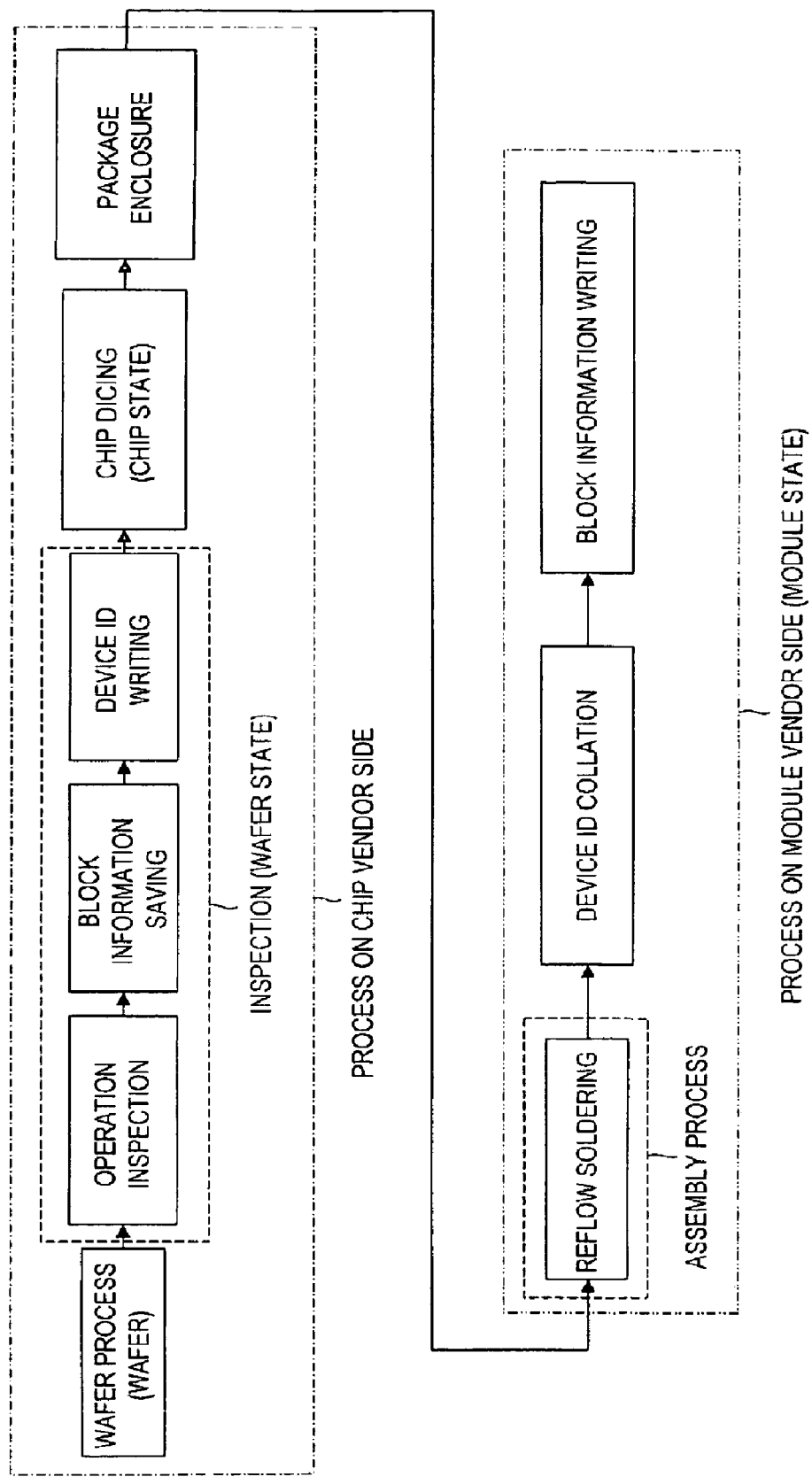
FIG. 5 is a view showing an example of the process in the manufacturing method of a phase change memory module according to the first embodiment of the present invention.

FIG. 5 shows a manufacturing process of the phase change memory module using the memory array shown in FIG. 1. In the figure, a process on the chip vendor side and a process on the module vendor side are shown, respectively. First, the chip vendor fabricates the memory array shown in FIG. 1 on a silicon wafer in the wafer process to obtain a memory in a wafer state.

Thereafter, the memory in a wafer state is inspected. This inspection consists of three steps. First, an operation inspection for confirming the operation of all the bits and identifying the bad block including the defect bit is executed. Second, block information saving for saving the information of the bad block including the defect bit obtained by the operation inspection is executed. This information of the bad block is saved in a peripheral storage such as a hard disk drive as described later, and is used later when the module vendor writes the bad block information in the spare field SFD. Finally, the device ID which is an ID specific to the memory is written in the vendor field BFD shown in FIG. 1.

After the completion of the above-described inspection step, the silicon wafer is divided into memory chips in step of chip dicing, and thereafter, the chips are enclosed into package. The chip vendor performs the process up to enclosing the memory chip into package. The above-described manufacturing process has the following features.

The first feature is that a step of saving the bad block information obtained by the operation inspection in the storage medium outside the memory is provided. By this feature, even when a step such as the reflow soldering is performed later by the module vendor, since the bad block information is not stored in the spare field SFD at this point of time, the bad block information is not lost by the thermal load.

The second feature is that a step of storing the device ID in the vendor field BED is provided. By this feature, the device ID is stored in the field not lost even in a subsequent step such as reflow soldering, and therefore, the bad block information to be written in the spare field can be obtained from the peripheral storage by referencing the device ID.

The process from the inspection to the block information saving and the saving of the device ID can be performed in a random order.

Further, it is also possible to perform the package sealing before the saving of the block information and the saving of the device ID are performed. However, by performing the package sealing after the saving of the block information and the saving of the device ID are performed like in the present embodiment, it becomes unnecessary to provide a writing step after the package sealing, and hence, it is possible to prevent the process from being complicated.

Next, the process on the module vendor side will be described. First, the module vendor mounts the memory chip sealed into the package on a printed wiring board to assemble the memory module. Since there is a step of performing the reflow soldering in this process, the storage information stored in the phase change element is likely to be lost by the thermal load of the reflow soldering. Thereafter, the device ID stored in the vendor field BFD is collated with the bad block information stored in the storage medium described above, thereby obtaining the bad block information previously inspected by the chip vendor. Finally, the obtained bad block information is written in the spare field shown in FIG. 1.

The above-described manufacturing process has the following features.

The first feature is that the writing of the bad block information is performed after the assembly process. By this feature, since the bad block information is written after the step in which the thermal load is applied, there is no risk of losing the information due to the thermal load, and the bad block information can be stored without fail.

The second feature is that the bad block information stored in the storage medium can be obtained by collating it with the device ID stored in the vendor field BFD. Since the device ID is stored in the vendor field BFD which can retain the stored information even when the thermal load is applied as described above, it is possible to collate the bad block information with the device ID after the assembly process. Further, as compared with the case where bad block information is all stored in the vendor field BFD, the amount of information is smaller in the case where the device ID only is stored in the vendor field, and the increase of the cell area by the vendor field can be favorably suppressed.

The third feature is that the bad block information is stored outside the memory module. By storing the bad block information outside, the loss of the storage information due to the thermal load can be prevented, and moreover, as compared with the case where the bad block information is stored in the vendor field, the increase of the cell area can be suppressed.

<<Inspection of Phase Change Memory in Chip Vendor>>

Figure 6:
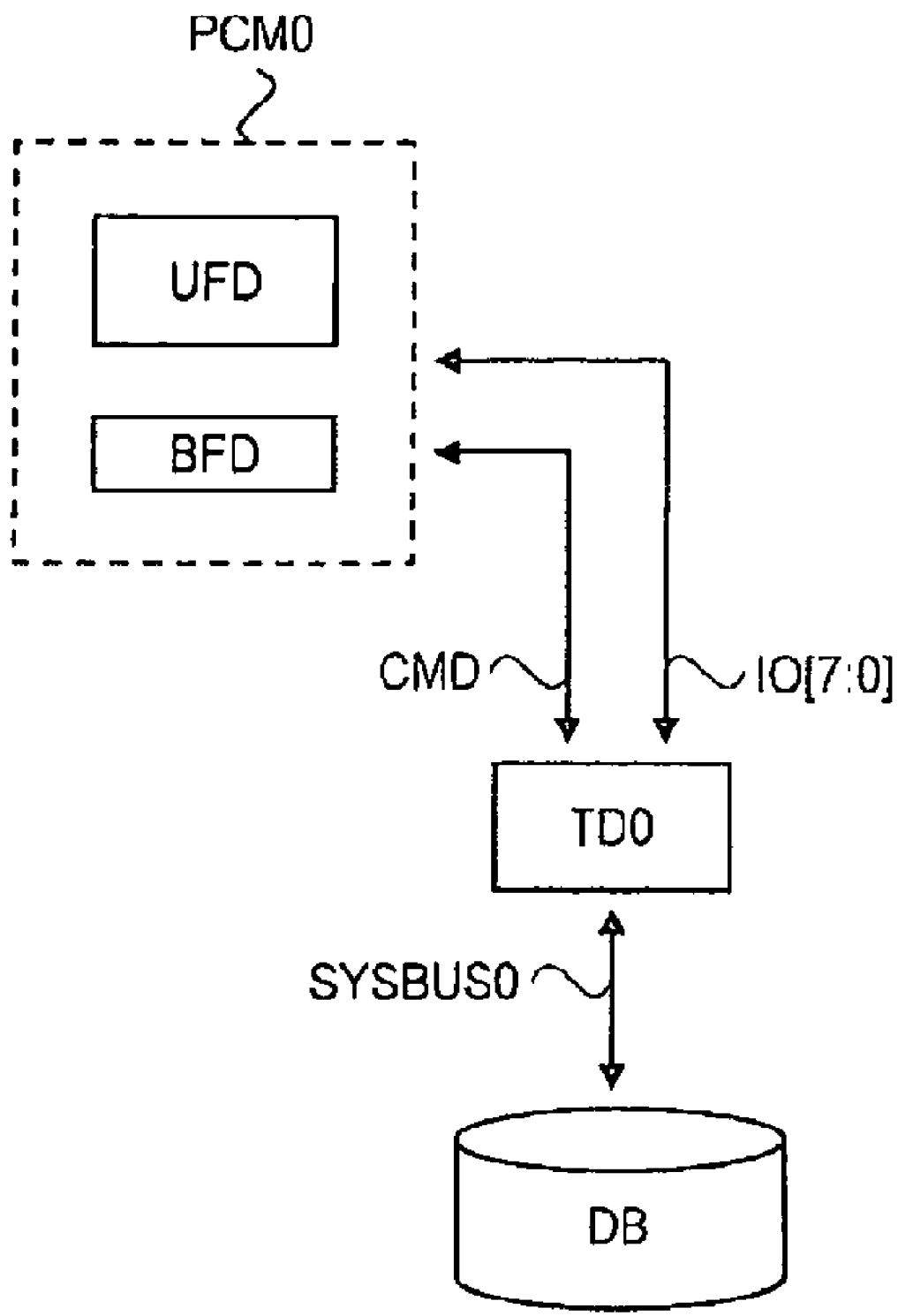
FIG. 6 is a view showing an example of an inspection system of the non-volatile memory constituted of the memory array shown in FIG. 1 in the manufacturing method of a phase change memory module according to the first embodiment of the present invention.

Next, an inspection system and an inspection method of the phase change memory in the chip vendor will be described. FIG. 6 shows an example of the inspection system of the phase change memory in the present embodiment. This inspection system is constituted of a phase change memory PCM0, a testing device TD0 and a database DB. As shown in FIG. 1, the phase change memory PCM0 is constituted of the memory array composed of two fields of the user field UFD and the vendor field BFD. The testing device TD0 is a semiconductor inspection device for performing an inspection in a wafer state and is constituted of a semiconductor prober, a semiconductor tester, a personal computer for controlling them and others. The database DB is used for saving the inspection result of the phase change memory PCM0 and is constituted of, for example, a hard disk drive (HDD) and others, and the bad block information is saved in the database DB so that the defect bit information for each memory cell of the main field MED can be taken out by collating the bad block information with the device ID stored in the vendor field BFD.

As described above, by the step of storing the device ID in the vendor field, the bad block information can be referenced from the hard disk drive and written in the spare field SFD, and therefore, as compared with the case where the bad block information is stored in the vendor field, the phase change memory capable of preventing a loss of the bad block information due to thermal load by the manufacturing process can be realized, while preventing the increase of the cell area.

The testing device is connected to the phase change memory PCM0 through the input/output line IO [7:0] and a block of control signals CMD. The block of control signals CMD is constituted of a command latch enable signal CLE, a chip enable signal CEB, an address latch enable signal ALE, a write enable signal WEB, a ready/busy signal RBB, and others. The detail of these signals will be described later together with the operation of the phase change memory. The testing device is connected further to the database DB through a system bus SYSBUS0.

Figure 7:
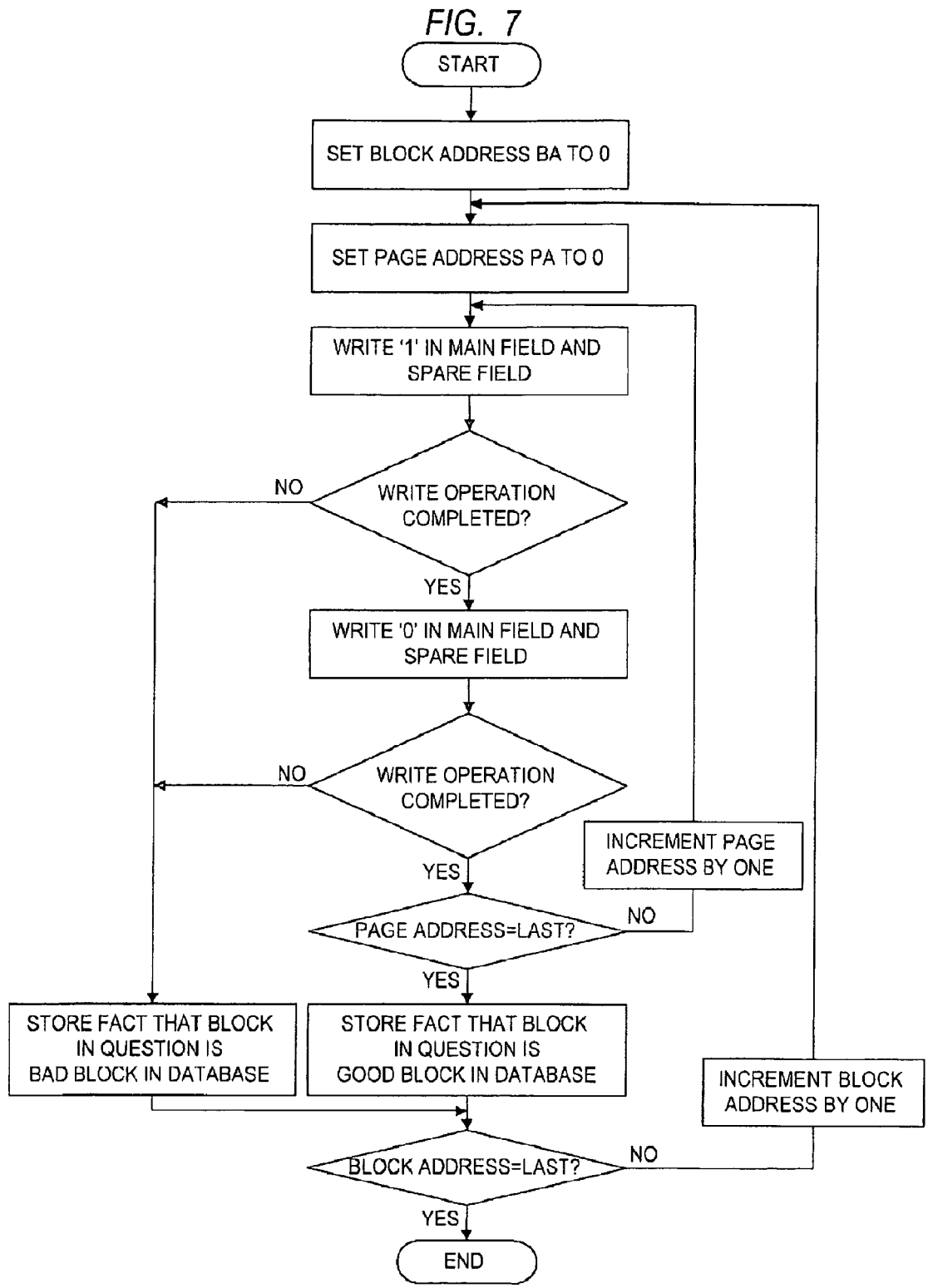
FIG. 7 is a view showing an example of an inspection sequence of the non-volatile memory constituted of the memory array shown in FIG. 1 in the manufacturing method of a phase change memory module according to the first embodiment of the present invention.

FIG. 7 shows an inspection sequence executed by the inspection system of the phase change memory shown in FIG. 6. For simplifying the description, the inspection sequence per one chip is shown here. First, a block address BA is set to 0. Next, a page address PA is set to 0. Subsequently, information '1' is written in the main field and the spare field in the user field shown in FIG. 1, and it is confirmed whether or not the write operation is completed. This confirmation operation is, for example, a read operation of a value of a register in the phase change memory as will be described with reference to FIG. 9. For the purpose of accuracy, it is also possible to directly read the written information as will be described with reference to FIG. 10. If the write operation can be performed as expected, the write operation of the information '0' is also confirmed in the same manner. If both pieces of information can be correctly written, the same inspection is repeated after incrementing the page address by one. When the storage information can be written up to the last page as expected, the fact that all the bits of the block are operable, that is, the good block information is saved in the database DB shown in FIG. 6. Meanwhile, when the storage information cannot be written as expected, the fact that the defect bit is included in the block, that is, the bad block information is saved in the database DB. The above-described inspection is repeated until the last block.

Although an example of the case where operation check is performed by using the data pattern of all bit '1' or '0' is shown in FIG. 7, various types of the data pattern can be used. For example, the operation check can be performed also by using a so-called checker pattern in which the information '1' and the information '0' are alternately arranged. In this case, since the influence of the mutual interference generated between the adjacent cells can also be detected, a highly accurate inspection can be performed.

FIG. 8 shows an example of the inspection result saved in the database DB shown in FIG. 6. The contents to be saved are the device ID, the block address and the state of the block. As described in FIG. 7, whether all the bits are operable (Good) or the defect bit is included (Bad) is saved for each block address.

<<Operation of Phase Change Memory>>

Figure 9:
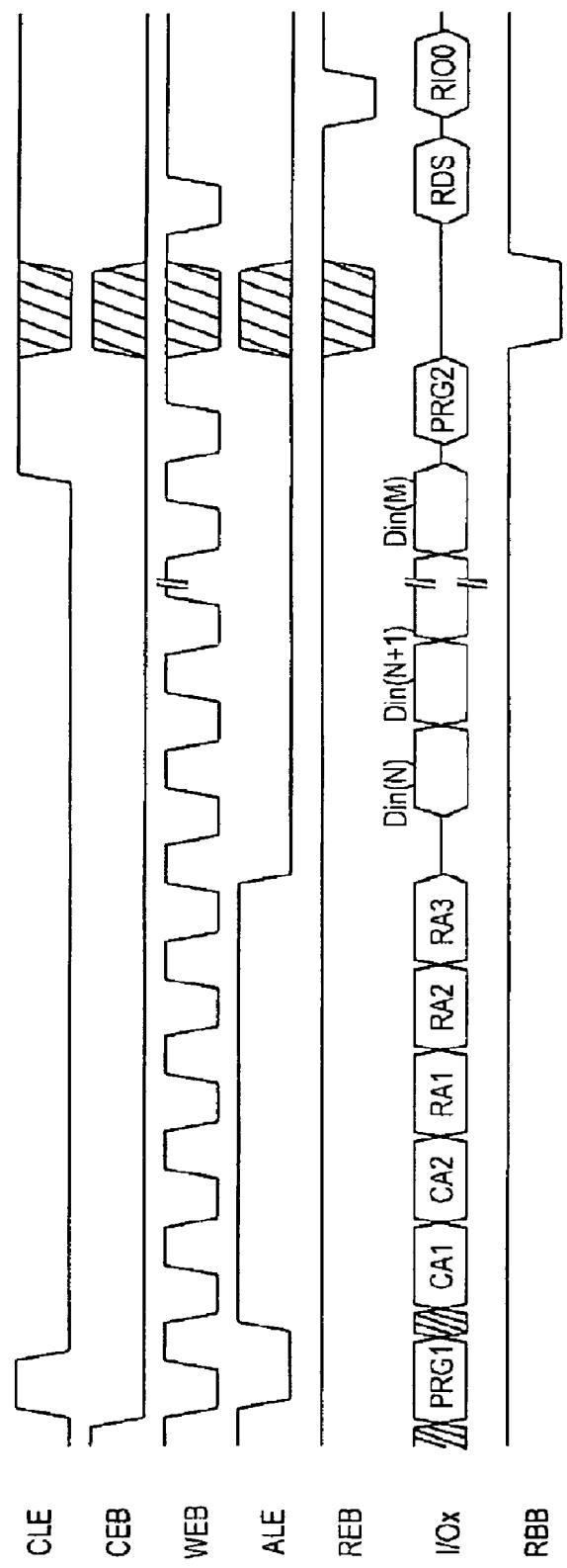
FIG. 9 is a view showing an example of a write operation of the non-volatile memory constituted of the memory array shown in FIG. 1 in the manufacturing method of a phase change memory module according to the first embodiment of the present invention.

First, an example of the write operation will be described with reference to FIG. 9. The command latch enable signal CLE at a low level is driven to a high level, and the chip enable signal CEB and the address latch enable signal ALE at a high level are driven to a low level. Thereafter, when a first write command signal PRG1 is inputted through an input/output line I/Ox (x=0 to 7), the first writing signal command PRG1 is fetched into the phase change memory by the rising edge of the write enable signal WEB. Next, the command latch enable signal CLE at the high level is driven to the low level, and the address latch enable signal ALE at the low level is driven to the high level again, respectively, and the column address is inputted in order in two steps (CA1 and CA2) and the low address is inputted in order in three steps (RA1, RA2 and RA3). These addresses are fetched into the phase change memory by the rising edge of the write enable signal WEB, and decoding of the addresses is sequentially performed inside the chip. Further, the address latch enable signal ALE at the high level is driven to the low level, and pieces of storage information Din(N) to Din(M) are inputted through the input/output line I/Ox (x=0 to 7). Subsequently, the command latch enable signal CLE at the low level is driven to the high level, and a second rewrite command signal PRG2 is inputted to the input/output line I/Ox (x=0 to 7). This second initialization command signal PRG2 is fetched into the phase change memory by the rising edge of the write enable signal WEB, and the rewrite operation is performed inside the chip. In the rewrite operation, the ready/busy signal RBB at the high level is driven to the low level. The ready/busy signal RBB at the low level after finishing the rewrite operation is driven to the high level, and thereafter, a state read command signal RDS is inputted. The state read command signal RDS is fetched into the chip by the rising edge of the write enable signal WEB. Further, in synchronization with the read enable signal RDB, a state after writing RIO0 which is temporarily stored in the register in the chip is outputted from the input/output line I/Ox (x=0 to 7).

Figure 10:
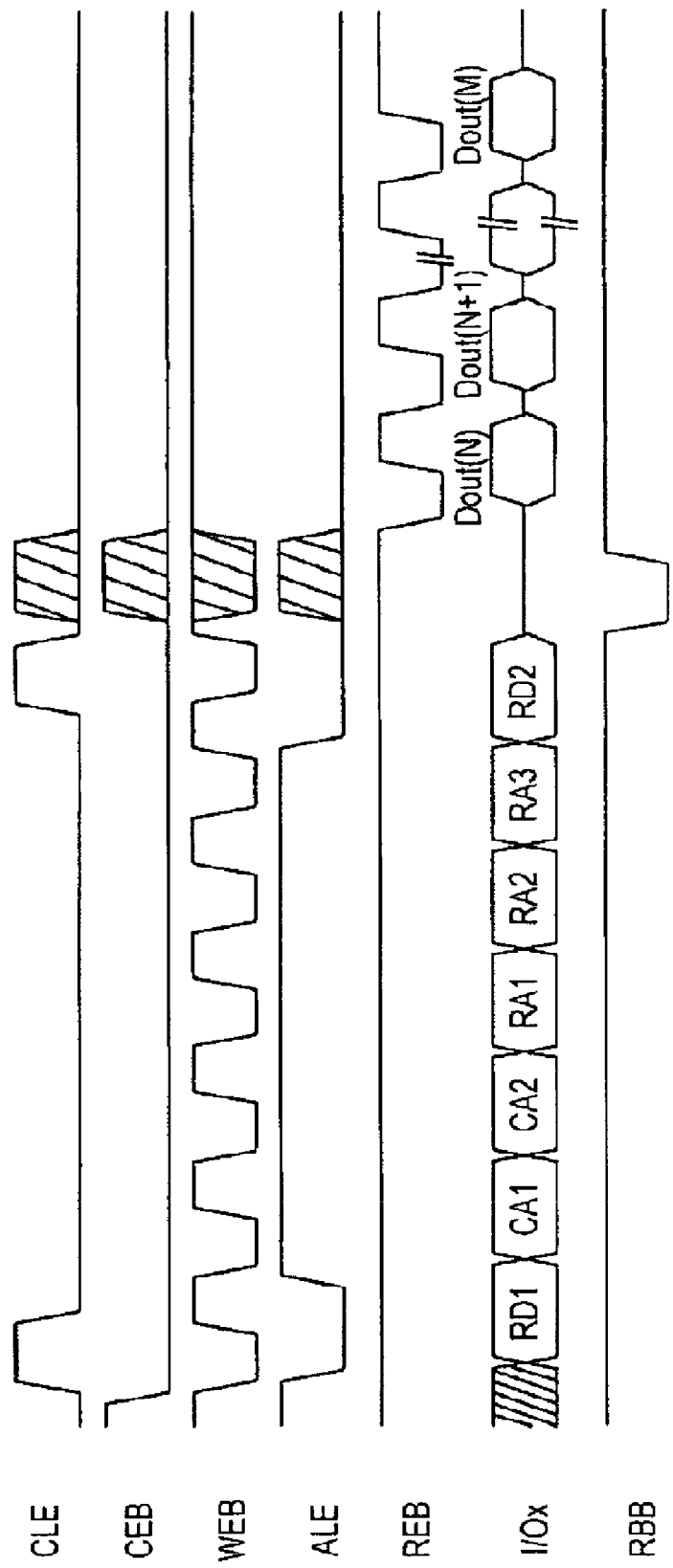
FIG. 10 is a view showing an example of a read operation of the non-volatile memory constituted of the memory array shown in FIG. 1 in the manufacturing method of a phase change memory module according to the first embodiment of the present invention.

Next, an example of a road operation will be described with reference to FIG. 10. The command latch enable signal CLE at the low level is driven to the high level, and the chip enable signal CEB and the address latch enable signal ALE at the high level are driven to the low level. Thereafter, when a first read command signal RD1 is inputted through the input/output line I/Ox (x=0 to 7), the first read command signal RD1 is fetched into the phase change memory by the rising edge of the write enable signal WEB. Next, the command latch enable signal CLE at the high level is driven to the low level and the address latch enable signal ALE at the low level is driven to the high level again, respectively, and the column address is inputted in order in two steps (CA1 and CA2) and the low address is inputted in order in three steps (RA1, RA2 and RA3). These addresses are fetched into the phase change memory by the rising edge of the write enable signal WEB, and decoding of the addresses is sequentially performed inside the chip. Further, the address latch enable signal ALE at the high level is driven to the low level and the command latch enable signal CLE at the low level is driven to the high level, respectively, and a second read command signal RD2 is inputted to the input/output line I/Ox (x=0 to 7). This second read command signal RD2 is fetched into the phase change memory by the rising edge of the write enable signal WEB, and the read operation is performed. In the read operation, the ready/busy signal RBB at the high level is driven to the low level. The storage information read from the memory array is transferred inside the chip, and after the ready/busy signal RBB at the low level is driven to the high level, it is outputted in order of Dout(N) to Dout(M) in synchronization with the rising edge of the read enable signal REB.

<<Writing Method of Block information in Module Vendor>>

Figure 11:
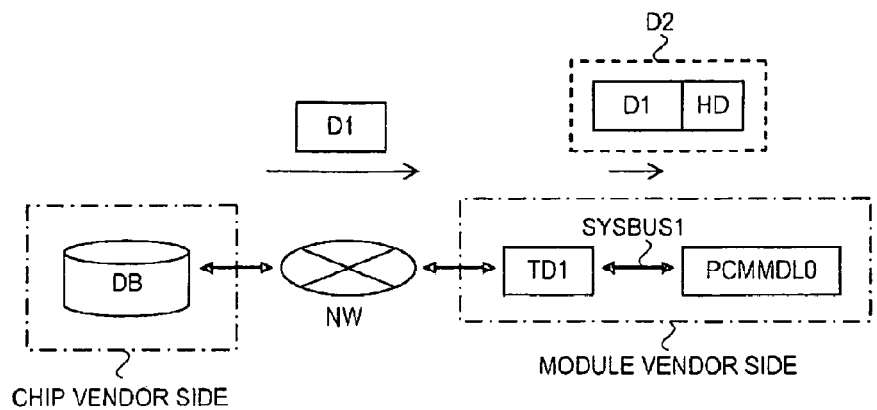
FIG. 11 is a view showing an example of a system for writing the block information in the non-volatile memory constituted of the memory array shown in FIG. 1 in the manufacturing method of a phase change memory module according to the first embodiment of the present invention.

Next, the writing method of the block information of the phase change memory in the module vendor will be described. FIG. 11 shows an example of the block information writing system of the phase change memory in the present embodiment. This writing system is connected to the database DB on the chip vendor side through a network NW, and is constituted of a testing device TD1 and a phase change memory module PCMMDL0. The testing device TD1 is connected to the phase change memory module PCMMDL0 through a system bus SYSBUS1. Further, the testing device TD1 is a semiconductor inspection device for performing the inspection of the phase change memory soldered and modularized on a printed wiring board, and is constituted of an inspection dedicated board, a semiconductor tester, a personal computer for controlling them, an interface circuit block in conformity to the specification of the system bus SYSBUS1, and others.

Figure 12:
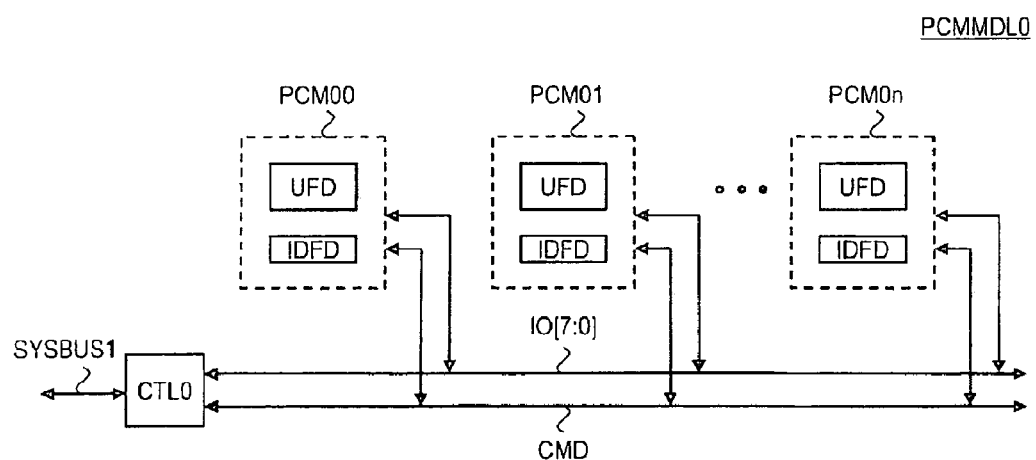
FIG. 12 is a view showing an example of a configuration of a phase change memory module using the non-volatile memory constituted of the memory array shown in FIG. 1 in the manufacturing method of a phase change memory module according to the first embodiment of the present invention.

FIG. 12 shows a configuration of the phase change memory module PCMMDL0. In the configuration of the phase change memory module PCMMDL0, the phase change memories PCM00 to PCM0n having the configuration shown in FIG. 6 are connected to a control circuit CTL0. The control circuit CTL0 is constituted of the interface circuit block in conformity to the specification of the system bus SYSBUS1, a microprocessor, a programmable logic device, a field programmable gate array FPGA, an application specific integrated circuit, and others, and it generates a command and an input data based on the information received from the semiconductor inspection device and writes the block information in the phase change memories PCM00 to PCM0n.

The system bus SYSBUS1 shown in FIG. 11 and FIG. 12 has an input/output pin configuration and an electric characteristic in conformity to the specification of, for example, a serial advanced technology attachment (ATA), an inter-integrated circuit (or I2C), a peripheral component interconnect (PCI) bus and others. Upon receipt of an inspection result D1 from the network NW, as shown in FIG. 11, the testing device TD1 converts it into information D2 in accordance with the specification of the system bus SYSBUS1, and then transfers it to the phase change memory module PCMMDL0. The information D2 includes, for example, a header HD in accordance with the specification of the SYSBUS1 in addition to the inspection result D1. Upon receipt of the information D2, the control circuit CTL0 shown in FIG. 12 decrypts its content to generate an input signal in conformity to the specifications of the phase change memories PCM00 to PCNM0n, and transfers it to each memory. The information D2 may be appropriately divided in accordance with the write operation.

Figure 13:
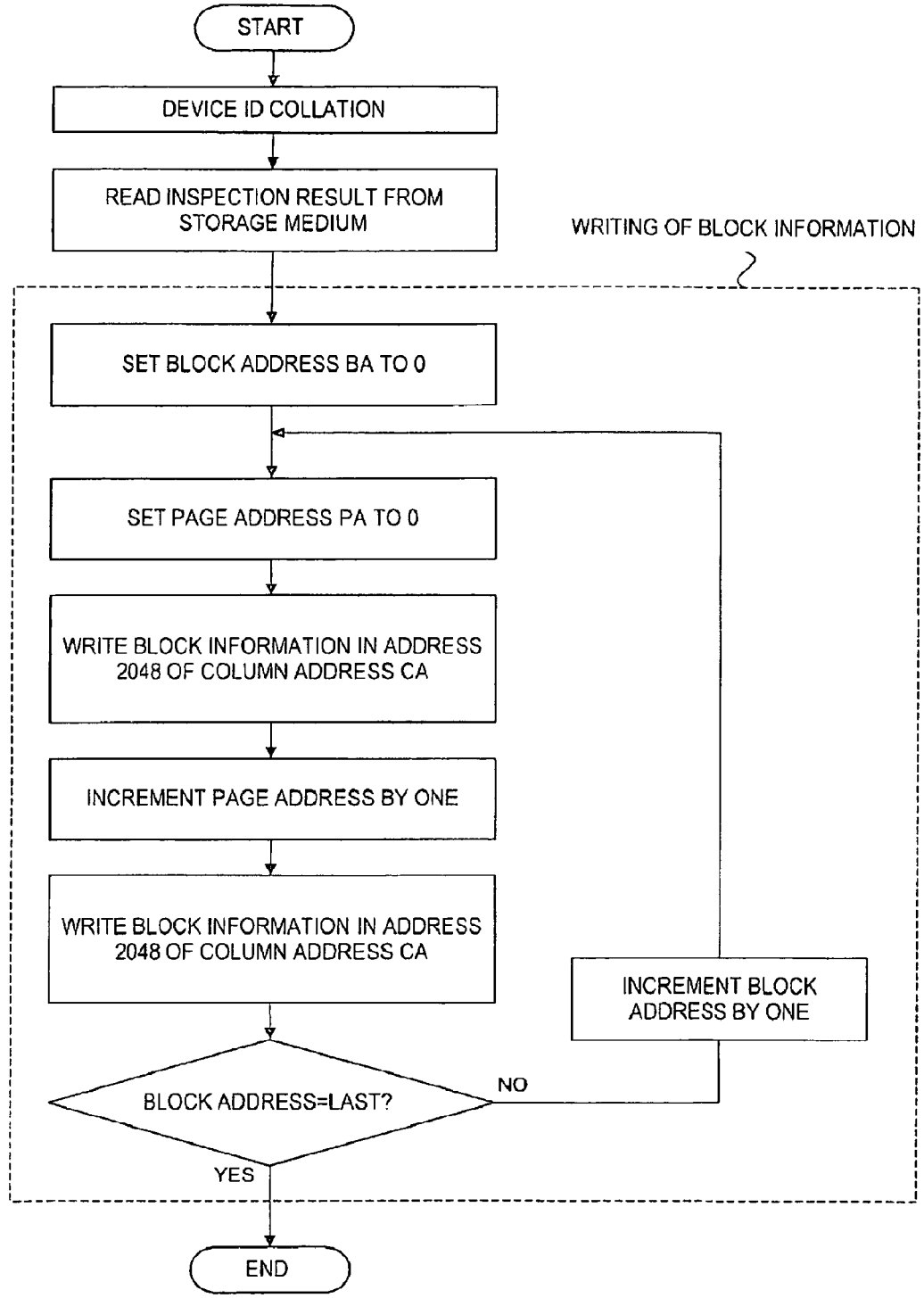
FIG. 13 is a view showing an example of a sequence of writing the block information in the non-volatile memory constituted of the memory array shown in FIG. 1 in the manufacturing method of a phase change memory module according to the first embodiment of the present invention.
Figure 14:
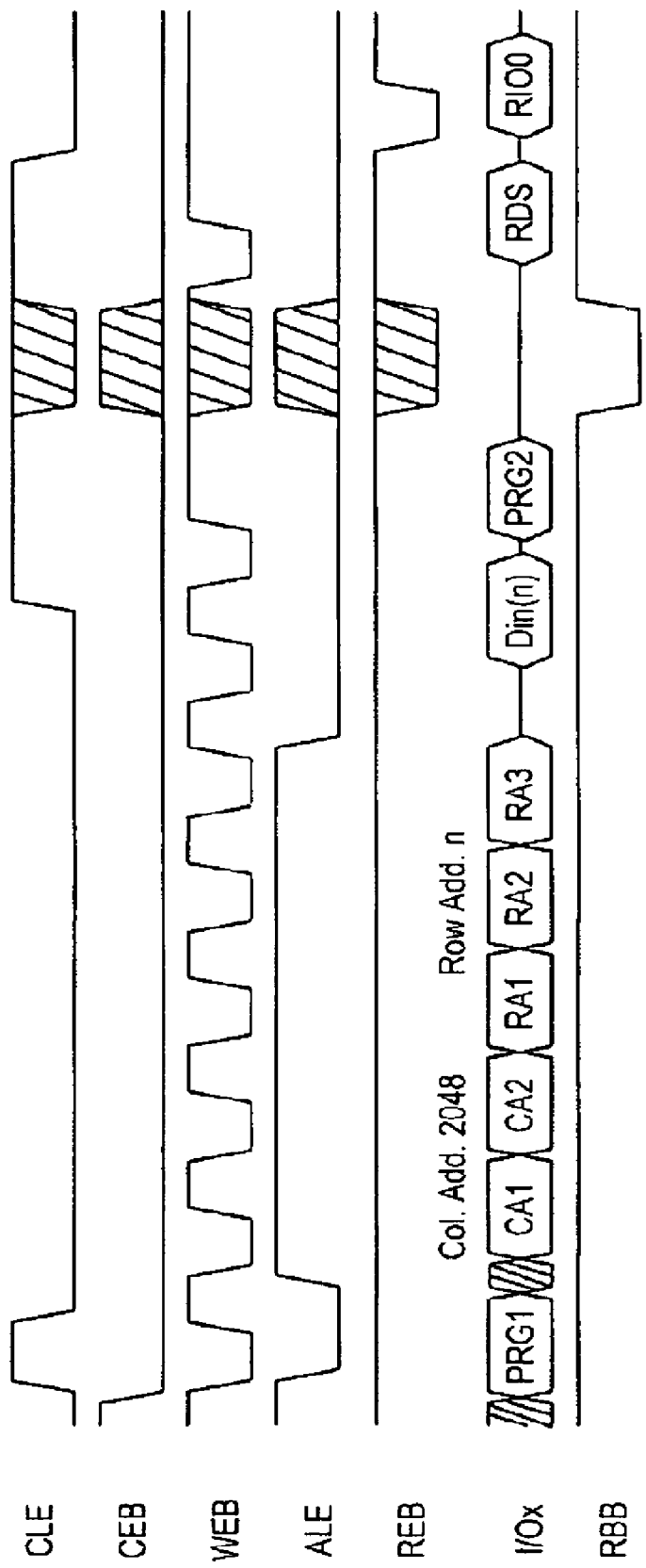
FIG. 14 is a view showing an example of a write operation at the time of recording the block information in the non-volatile memory constituted of the memory array shown in FIG. 1 in the manufacturing method of a phase change memory module according to the first embodiment of the present invention.

FIG. 13 shows the process after the reflow soldering in the manufacturing process shown in FIG. 5. For simplifying the description, the process of one phase change memory is shown in this figure. First, the device ID stored in the vendor field BFD shown in FIG. 1 is read, and is collated with the information stored in the database DB on the chip vendor side through the network NW shown in FIG. 11. Next, the inspection result of the device is obtained from the database DB, and the block information is written. First, a state is written in the field whose block address BA is 0 (decimal number). More specifically, the block information is written in the field of one byte selected by a column address 2048, a block address 0 and a page address 0. This field is the spare field in the user field UFD shown in FIG. 1, and is constituted of the same small-area memory cell as the main field. When all the bits in the same block can operate, the good block information is written (here, all bit 1). On the other hand, when the defect bit is included in this block, the bad block information is written. The bad block information preferably has the data pattern other than all bit 0 but is, for example, all 0 bits. The same information is written in the field of one byte selected by the column address 2048, the block address 0 and a page address 1. The operation as described above is performed for all the blocks while incrementing the block address by one. FIG. 14 shows a timing chart in the write operation at the time of recording the block information. This figure conforms to the timing chart shown in FIG. 9, where the write operation of one byte data is performed.

By the above-described phase change memory configuration and the module manufacturing method which make it possible to read the bad block information by accessing to the database DB on the chip vendor side through the network and referencing the device ID, the following three advantages can be obtained. The first advantage is that the chip vender can realize the highly integrated large capacity phase change memory using the Mostly Good Memory system. More specifically, the chip vendor performs a defect inspection, and the module vendor writes the bad block information in the spare field formed by the same small-area memory cell as the main field after the reflow soldering, whereby the higher integration of the large capacity phase change memory can be achieved. The second advantage is that the module vendor can realize the phase change memory module using the phase change memory of the Mostly Good Memory system. More specifically, the module vendor can reliably obtain the inspection result, that is, the bad block information from the chip vendor based on the device ID written in the vendor field constituted of the memory cell excellent in heat resistance. Further, by writing the block information based on the previous inspection result in the phase change memory after the reflow soldering, the block state of the modularized phase change memory can be discriminated. Further, since the phase change memory in which the block information is written in the spare field constituted of the same small-area memory cell as the main field is used, the small-area large capacity phase change memory module can be realized. The third advantage is that the end user using the phase change memory module can execute a reliable write operation in a short time. More specifically, by using the phase change memory module according to the present manufacturing method, the write operation can be immediately executed to the field where all the bits are operable, that is, to the good block field without confirming the presence of the defect bit at every operation. Further, by using the small-area phase change memory module, the area of the system also can be reduced.

Second Embodiment

Figure 15:
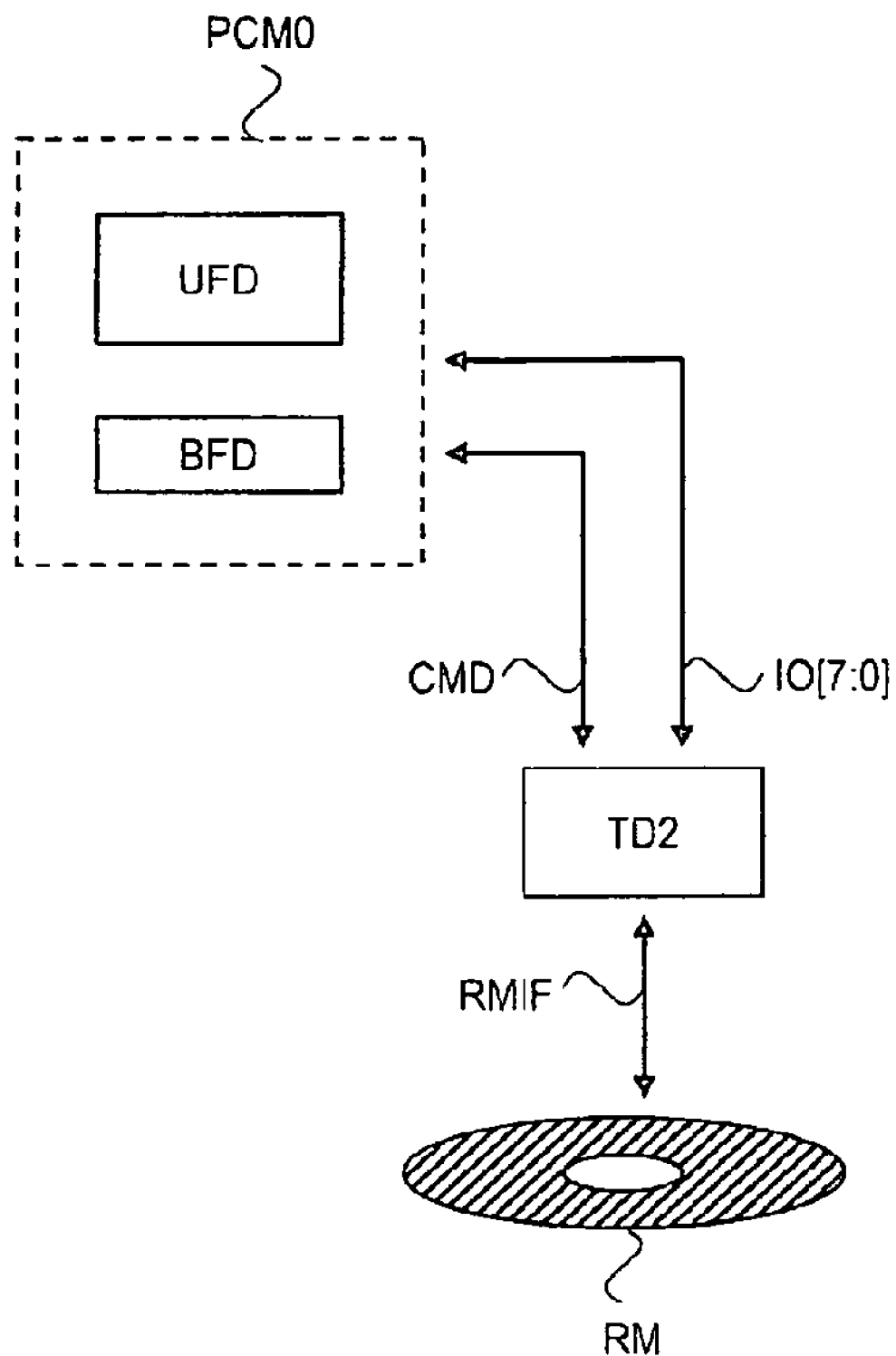
FIG. 15 is a view showing another example of an inspection system of the non-volatile memory constituted of the memory array shown in FIG. 1 in the manufacturing method of a phase change memory module according to the second embodiment of the present invention.

In the present embodiment, another configuration of the inspection system of the phase change memory in the chip vendor will be described. FIG. 15 shows the configuration example thereof. The feature of the configuration shown in the figure is that a medium to store the inspection result is replaced from a stationary database DB constituted of a hard disk drive (HDD) to a detachably removable media RM compared with the configuration shown in FIG. 6.

A testing device TD2 is a semiconductor inspection device for performing an inspection in a wafer state like the testing device TD0 shown in FIG. 6, and is constituted of a drive unit of the removable media RM in addition to a semiconductor prober, a semiconductor tester, a personal computer for controlling them and others. The testing device TD2 is connected to the removable media RM through a removable media interface RMIF in conformity to the type of the removable media RM. The removable media RM is a floppy disk, a magnet optical disk (MO), a compact disc (CD), a digital video disc (DVD), and others.

By replacing the storage medium of the inspection result from the database DB to the removable media RM as described above, the chip vendor is not required to have an enormous database DB, and the facility investment of the inspection system can be suppressed. On the other hand, the module vendor can write the block information in the phase change memory by obtaining the inspection result from the removable medium RM not through the network NW shown in FIG. 11 but through the personal computer and the like. Consequently, the facility investment on the module vendor side can also be suppressed.

Third Embodiment

Figure 16:
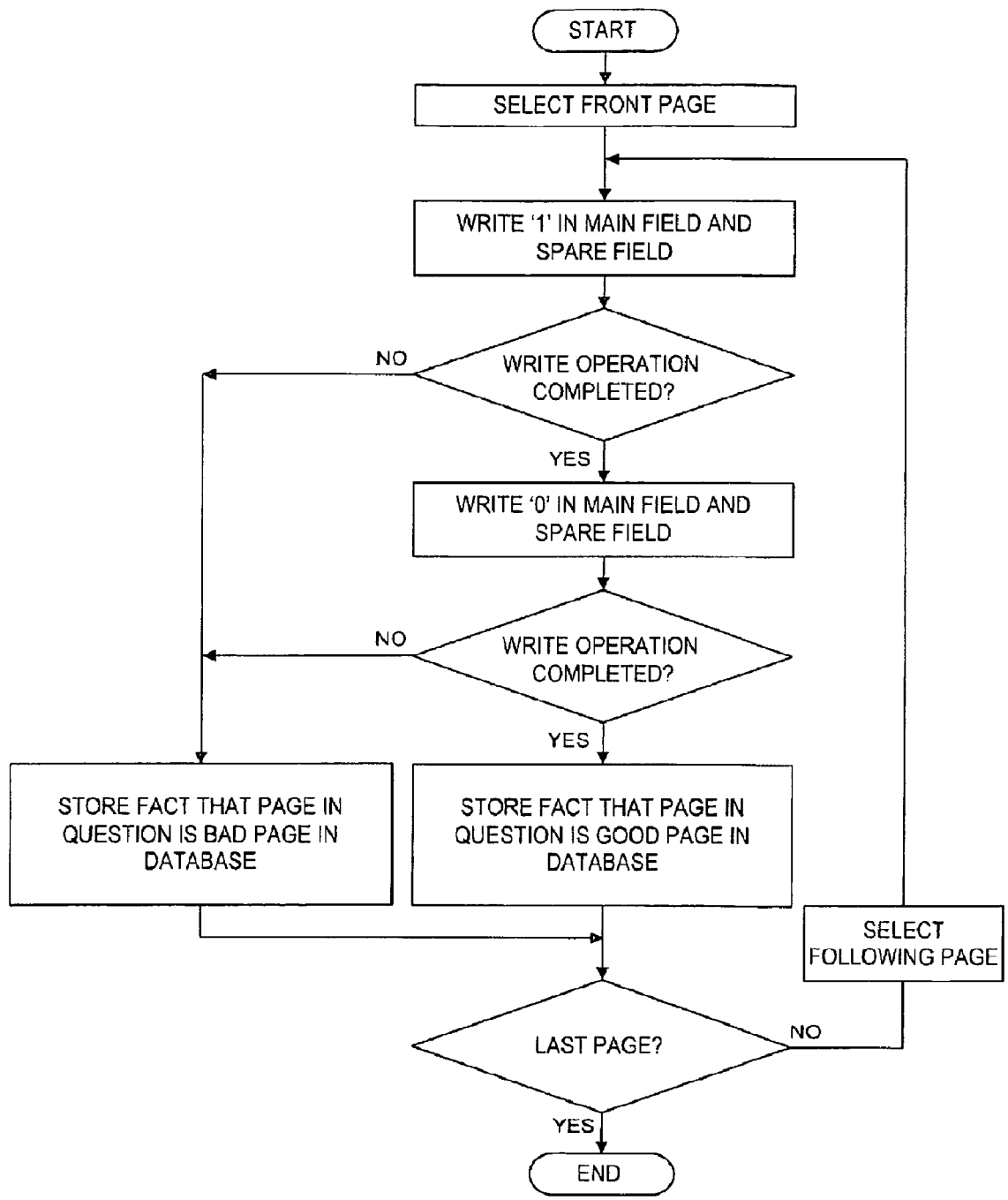
FIG. 16 is a view showing another example of an inspection sequence of the non-volatile memory constituted of the memory array shown in FIG. 1 in the manufacturing method of a phase change memory module according to the third embodiment of the present invention.
Figures 17, 18:
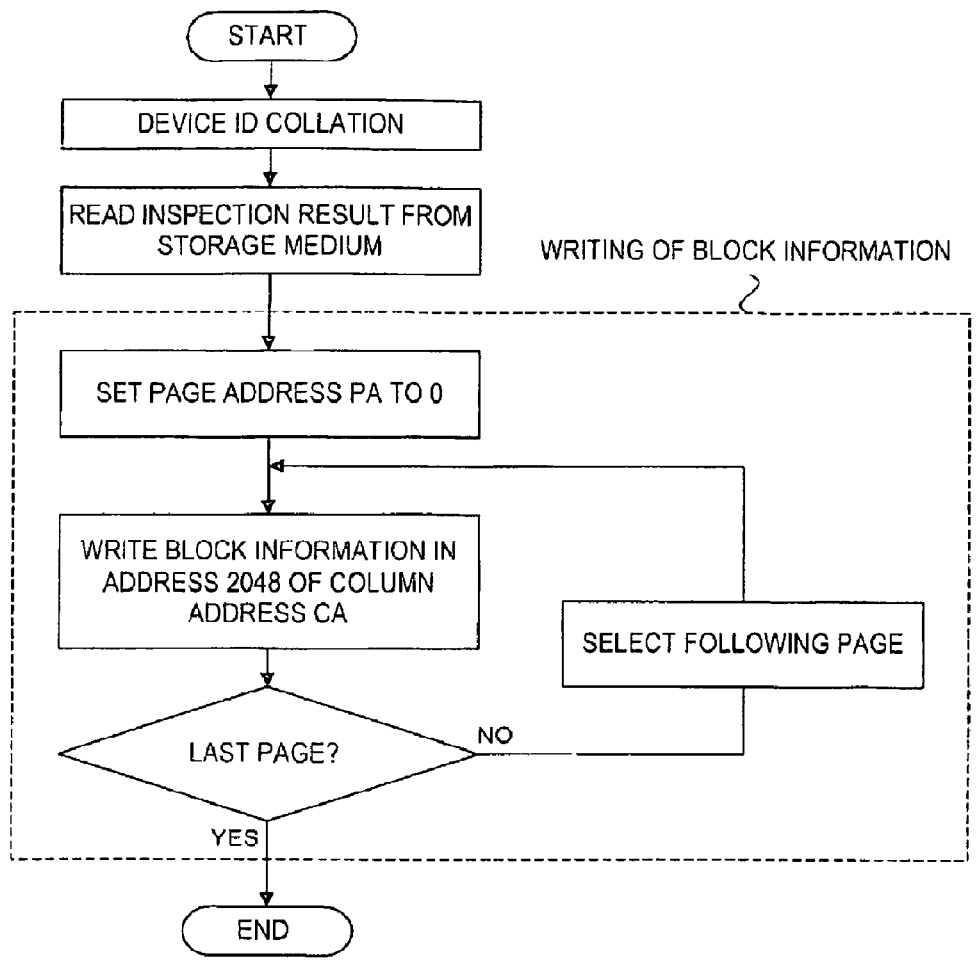
FIG. 17 is a view showing another example of a sequence of writing the block information of the non-volatile memory shown in FIG. 1 in the manufacturing method of a phase change memory module according to the third embodiment of the present invention.
FIG. 18 is a view showing another example of a content of an inspection result of the non-volatile memory constituted of the memory array shown in FIG. 1 in the manufacturing method of a phase change memory module according to the fourth embodiment of the present invention.

In the present embodiment, another sequence in the inspection of the phase change memory and the writing of the block information will be described. FIG. 16 and FIG. 17 show the examples of these sequences, respectively. As compared with the sequences shown in FIG. 7 and FIG. 13, the features of these sequences are that the valid field is distinguished for each page and its result (hereinafter, referred to as page information) is stored. These inspection sequences are effective for an overwritable phase change memory in which batch deletion of the field (here, block) constituted of a plurality of pages is not required like in the conventional NAND flash memory. When the defect bits are generated in only a specific page in a concentrated manner, the operable pages can be effectively used by making only that page invalid. Consequently, the number of valid bits can be increased.

Fourth Embodiment

The fourth embodiment shows another example of the write operation sequence at the time of recording the content of the inspection result and the block information in accordance with the inspection result in the phase change memory. FIG. 18 shows an example of the content of the inspection result according to the present embodiment. As compared with the content shown in FIG. 8, the feature of this content is that only the block address including the defect bit is recorded.

Figure 19:
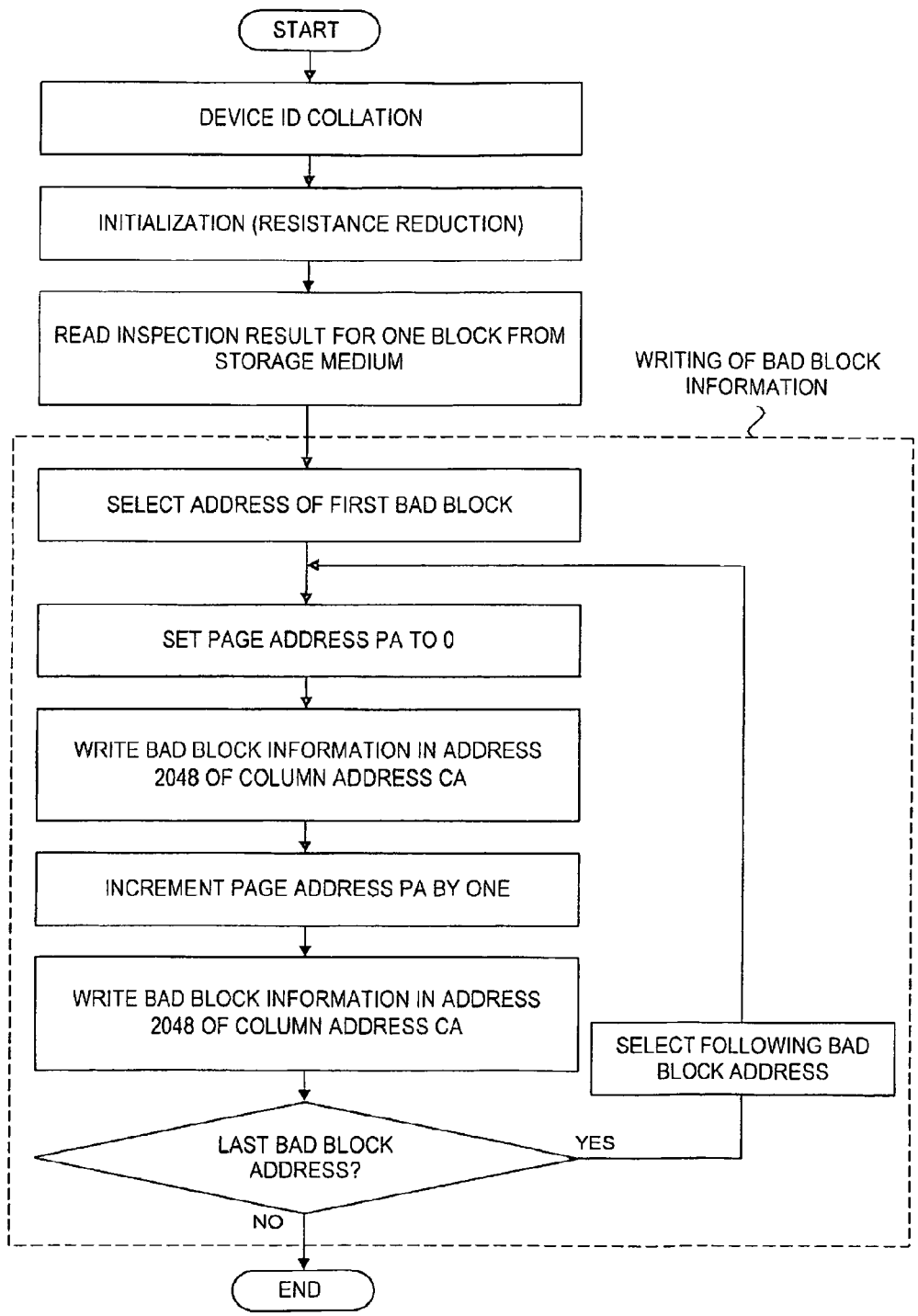
FIG. 19 is a view showing another example of a write operation sequence at the time of storing the block information of the non-volatile memory constituted of the memory array shown in FIG. 1 in the manufacturing method of a phase change memory module according to the fourth embodiment of the present invention.

FIG. 19 shows an example of the write operation sequence at the time of recording the content of the inspection result shown in FIG. 18 in the phase change memory. As compared with the sequence shown in FIG. 13, the feature of this sequence is that the bad block information only is written after performing the initialization operation. Here, the initialization operation is an operation for lowering the resistance of the memory cell. Since the phase change memory used in the present embodiment is likely to lose the storage information due to the reflow soldering, there is a possibility that the resistance value of the memory cell becomes an unexpected value. Hence, the resistances of all the bits are once lowered, that is, the information '1' is written in all the bits, and thereafter, the bad block information (for example, all the bit '0') is written in accordance with the content of the inspection result shown in FIG. 18.

As described above, the amount of the information saved in the database can be reduced depending on the content of the inspection result. In general, since the number of blocks including the defect bit is smaller than the number of blocks whose bits are all operable, the effect obtained by reducing the amount of the information becomes larger as the yield is increased. Also, by this write operation sequence, the block information can be written without fail. Further, the initialization state of the modularized phase change memory chip can be determined.

Fifth Embodiment

Figure 20:
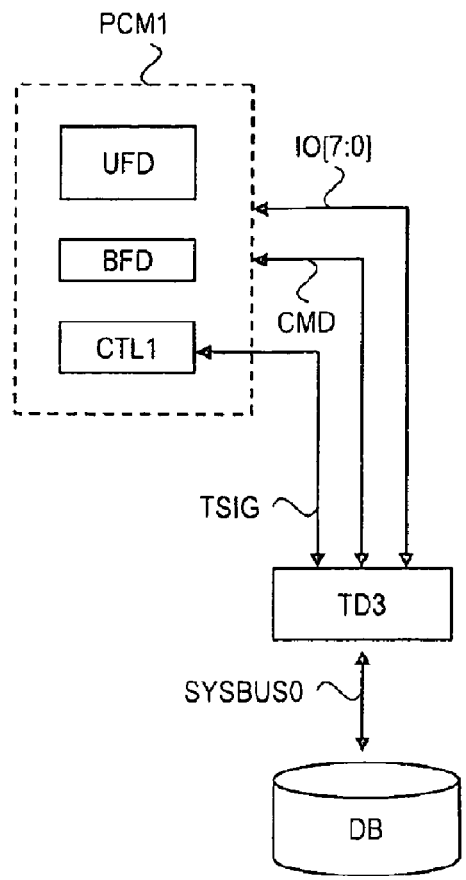
FIG. 20 is a view showing another example of a non-volatile memory array constituted of the memory array shown in FIG. 1 and an inspection system in the manufacturing method of a phase change memory module according to the fifth embodiment of the present invention.

In the fifth embodiment, another configuration of the phase change memory, the inspection system and the writing system will be described. FIG. 20 shows a configuration example of the phase change memory and the inspection system. The phase change memory PCM1 has a configuration obtained by adding a testing control circuit CTL1 to the phase change memory PCM0 shown in FIG. 6. The testing control circuit CTL1 is connected to a testing device TD3 through a testing signal line TSIG, and performs the exchange of control commands and data and the generation of chip internal control signals. Here, the testing control circuit CTL1 and the test signal group TSIG are the specification unique to the chip vendor and the already standardized specification. Similarly, the testing device TD3 has a control circuit and an interface according to the test specifications.

Figure 21:
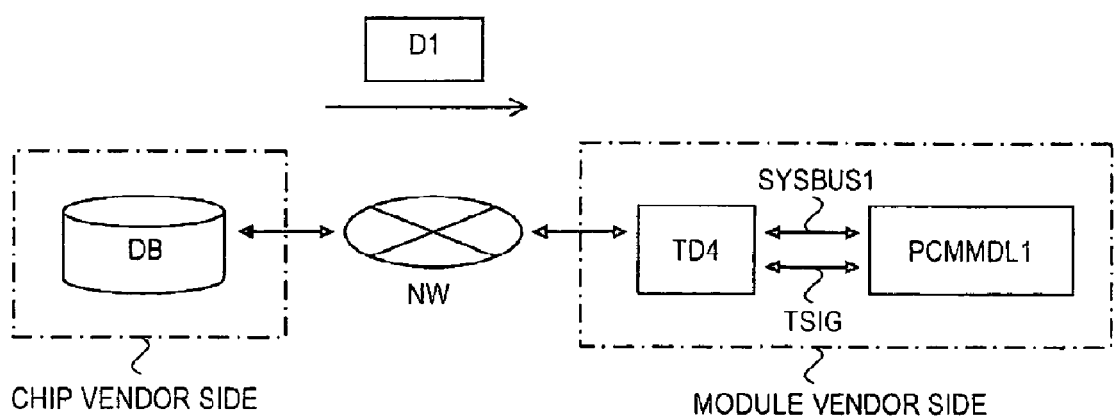
FIG. 21 is a view showing another example of a writing system for recording the block information of the non-volatile memory array shown in FIG. 1 in the manufacturing method of a phase change memory module according to the fifth embodiment of the present invention.

FIG. 21 shows an example of the inspection of the phase change memory and the block information writing system on the module vendor side. This system is constituted of a testing device TD4 and a phase change memory module PCMMDL1 like the system in FIG. 11. The feature of this system is that the testing device TD4 and the phase change memory module PCMMDL1 are connected through the test signal group TSIG in addition to the system bus SYSBUS1. Here, the testing device TD4 has a control circuit and an interface according to the test specifications.

Figure 22:
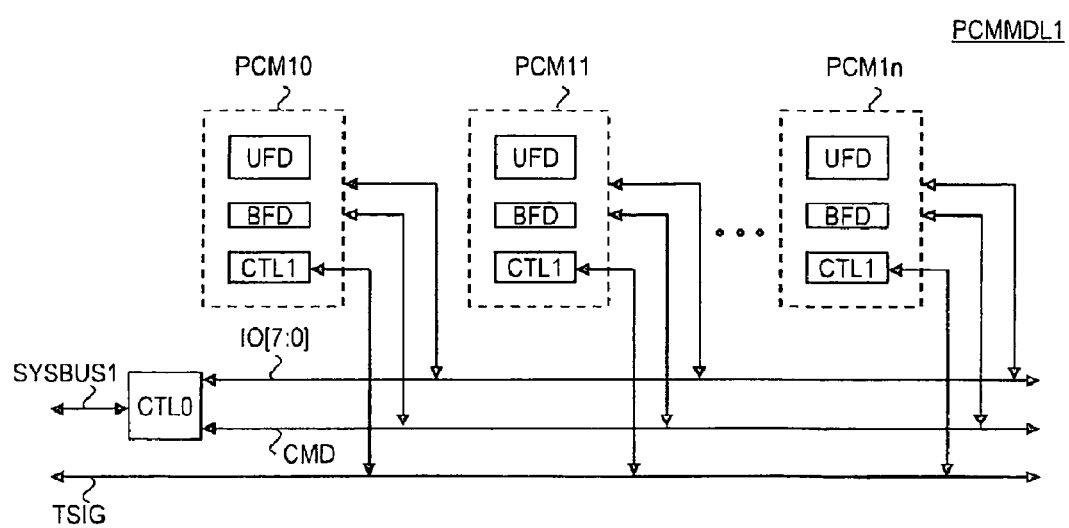
FIG. 22 is a view showing another example of a configuration of a phase change memory module using the non-volatile memory constituted of the memory array shown in FIG. 1 in the manufacturing method of a phase change memory module according to the fifth embodiment of the present invention.

FIG. 22 shows a configuration of the phase change memory module PCMMDL1. The phase change memory module PCMMDL1 has a configuration in which the phase change memories PCM10 to PCM1n having the configuration shown in FIG. 20 are connected to the control circuit CTL0 like in FIG. 12. The feature of this module is that the test signal group TSIG is further provided and the testing device TD4 and the phase change memories PCM10 to PCM1n are connected.

Next, as one example of the standardized test specifications, a configuration to which a joint test action group (JTAG) is applied will be described. The test signal group TSIG of the JTAG is constituted of a test input data signal TDI, a test output data signal TD0, a test mode selection signal TMC and a test clock signal TCK. The testing control circuit CTL1 mounted on the phase change memories PCM10 to PCM1n performs the input/output signal processing according to the JTAG specifications in cooperation with the control circuit in the phase change memory. By such test dedicated signal and the testing control circuit CTL1, the inspection of the phase change memories PCM10 to PCM1n and the write operation of the block information can be performed at a high speed.

Sixth Embodiment

Figure 23:
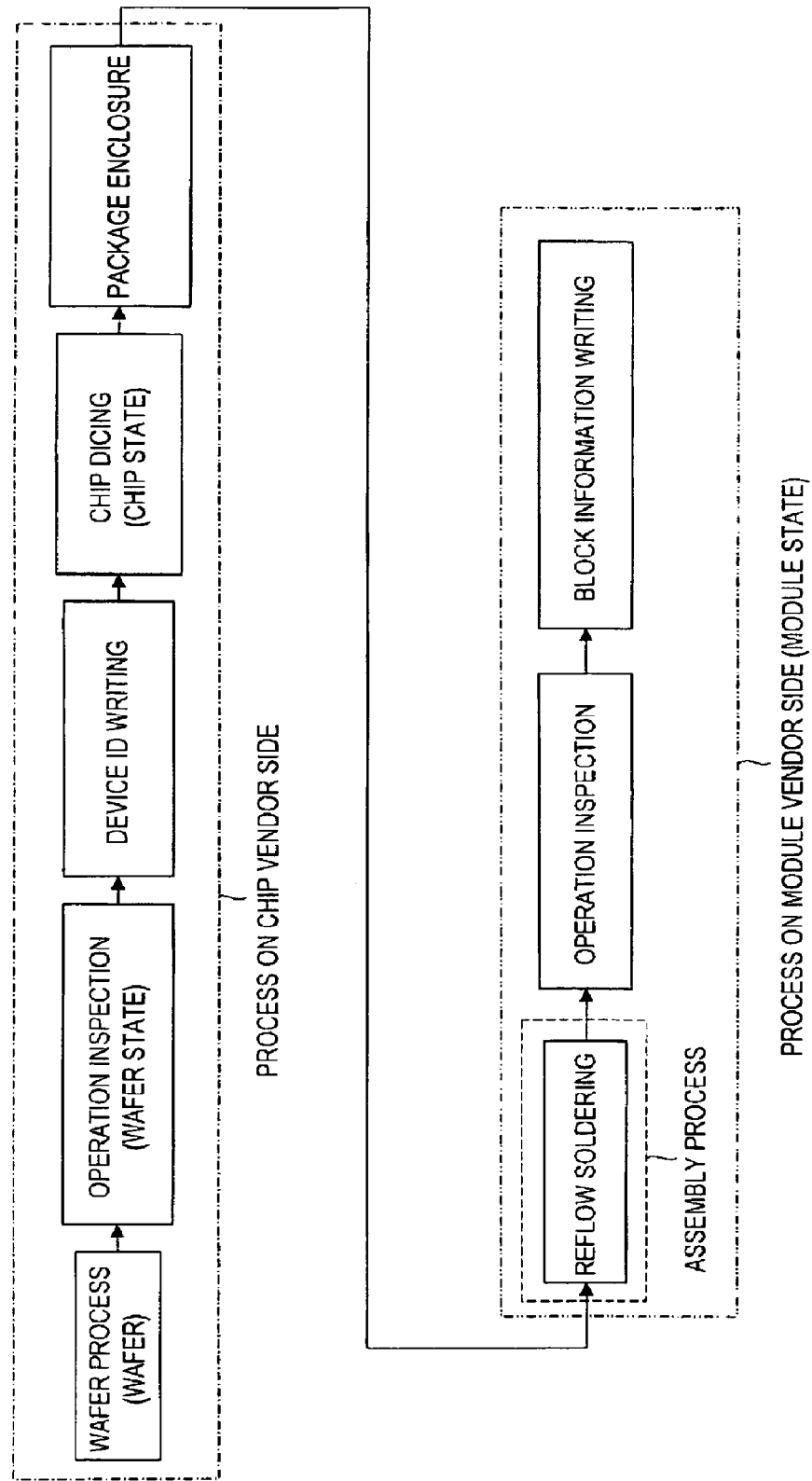
FIG. 23 is a view showing another example of the process in the manufacturing method of a phase change memory module according to the sixth embodiment of the present invention.

In the sixth embodiment, another process of the module manufacturing method will be described. As shown in FIG. 23, the feature of this process is that the module vendor performs the operation check (inspection) of all the bits of the phase change memory after the reflow soldering and the write operation of the block information. FIG. 24 shows an example of the inspection of the phase change memory and the block information writing system on the module vendor side. This system is constituted of a testing device TD5 and a phase change memory module PCMMDL0 like in FIG. 11. The feature of this testing device TD5 is that the testing device TD5 has both a function of performing the inspection of the phase change memory chip like the testing device TD0 shown in FIG. 6 and a function of writing the block information like the testing device TD1 shown in FIG. 11.

Figure 25:
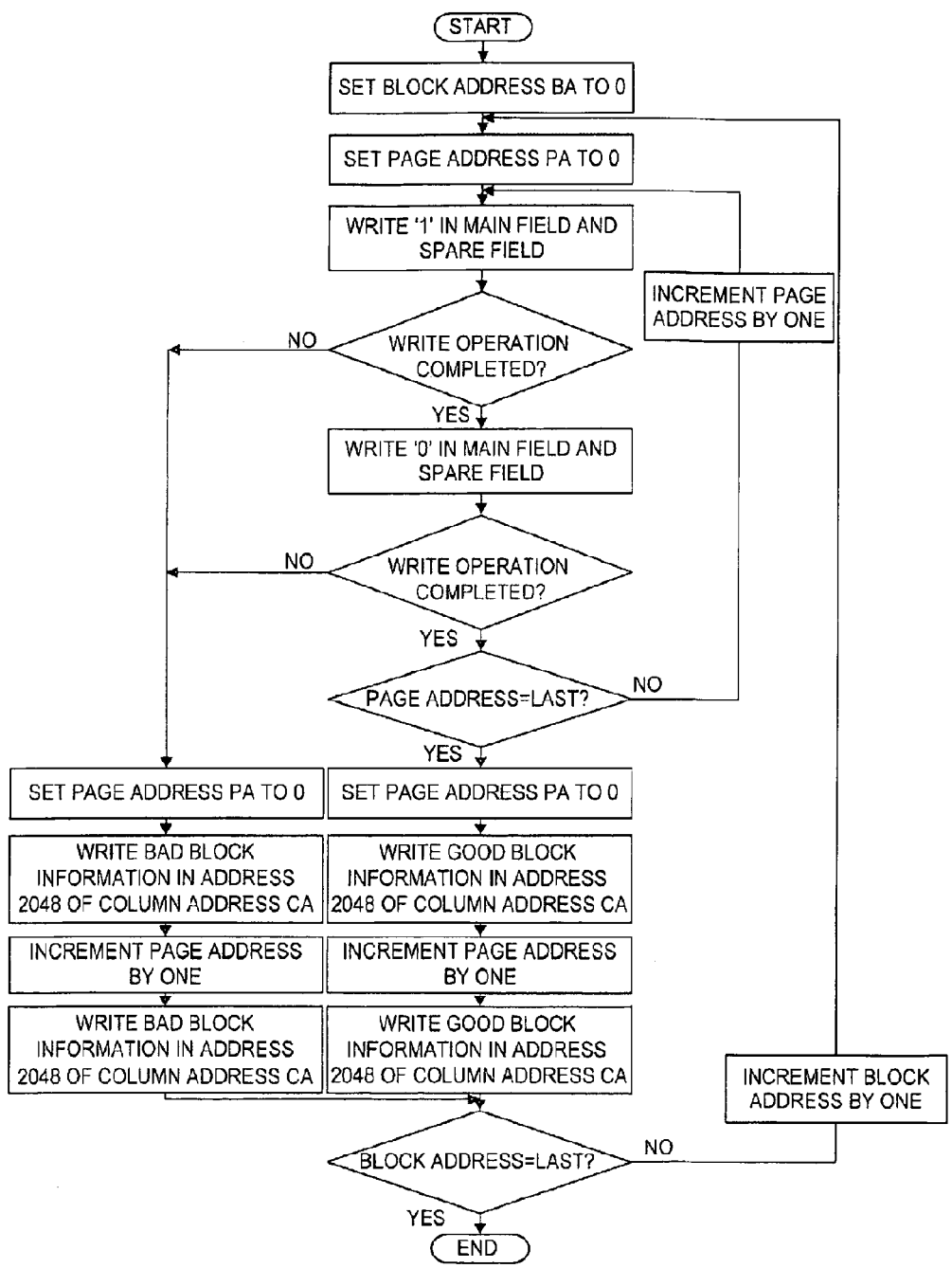
FIG. 25 is a view showing another example of an inspection sequence of the non-volatile memory constituted of the memory array shown in FIG. 1 in the manufacturing method of a phase change memory module according to the sixth embodiment of the present invention.

FIG. 25 shows the process after the reflow soldering in the manufacturing process shown in FIG. 23. For simplifying the description, the process of one phase change memory chip is shown in this figure. At the beginning, the operation of the field whose block address BA is 0 is confirmed. First, the block address is set to 0. Next, the page address PA is set to 0. Subsequently, the information '1' is written in the main field and the spare field in the user field shown in FIG. 1, and it is confirmed whether the write operation is completed. Further, for the purpose of accuracy, it is also possible to directly read the written information as described in FIG. 10. If the write operation can be performed as expected, the write operation of the information '0' is confirmed in the same manner. If both pieces of information can be correctly written, the same inspection is repeated after incrementing the page address PA by one. If the write operation can be performed up to the last page as expected, the fact that all the bits of the block are operable, that is, the good block information is written in the field of the column address 2048 of the page addresses 0 and 1 in the same manner as the sequence shown in FIG. 13. Meanwhile, if the write operation cannot be performed as expected, the fact that the block includes the defect bit, that is, the bad block information is written in the field. The above-described inspection and writing are repeated until the last block.

By the module manufacturing method as described above, the chip vendor is not required to store the inspection result in any sort of a storage medium. Further, the module vendor is released from a writing process of the good block information and the bad block information in an unusual circumstance connected to the network. More specifically, both the chip vendor and the module vendor can suppress the facility investment. Consequently, the manufacturing cost of the phase change memory module can be suppressed.

Seventh Embodiment

Figure 26:
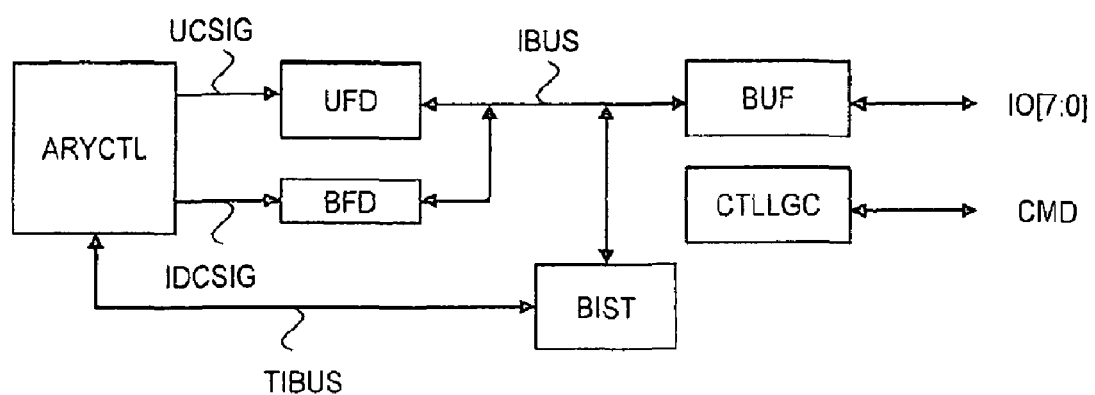
FIG. 26 is a view showing an example a configuration of a main circuit block of the non-volatile memory constituted of the memory array shown in FIG. 1 in the manufacturing method of a phase change memory module according to the seventh embodiment of the present invention.

In the seventh embodiment, still another configuration of the phase change memory will be described. FIG. 26 shows a main block diagram of the phase change memory PCM2. Similar to that in FIG. 1, this phase change memory has a memory array constituted of memory cells using a chalcogenide material and used for the user field UFD and a memory array constituted of memory cells excellent in heat resistance and used for the vendor field BED. An input/output butter DUE, a built-in self-test circuit BIST and a memory array control circuit ARYCTL are further added to this phase change memory.

The input/output buffer BUF exchanges the data, the address signal and the command signal with the external device through the input/output line IO [7:0], and at the same time, it exchanges the data and the signal with the user field UFD, the vendor field BFD and the built-in self-test circuit BIST through the chip internal bus IBUS, respectively. The built-in self-test circuit BIST generates and analyses the data pattern, the address signal and the command signal in order to confirm the operation of the memory array and write the block information in accordance with the command received through the chip internal bus IBUS. The data is exchanged with the memory array through the chip internal bus IBUS. The address signal and the command signal are exchanged with respective fields from the test chip internal bus TIBUS and the memory array control circuit ARYCTL through the user field control signal bus UCBUS and the vendor field control signal bus BCBUS.

Figure 27:
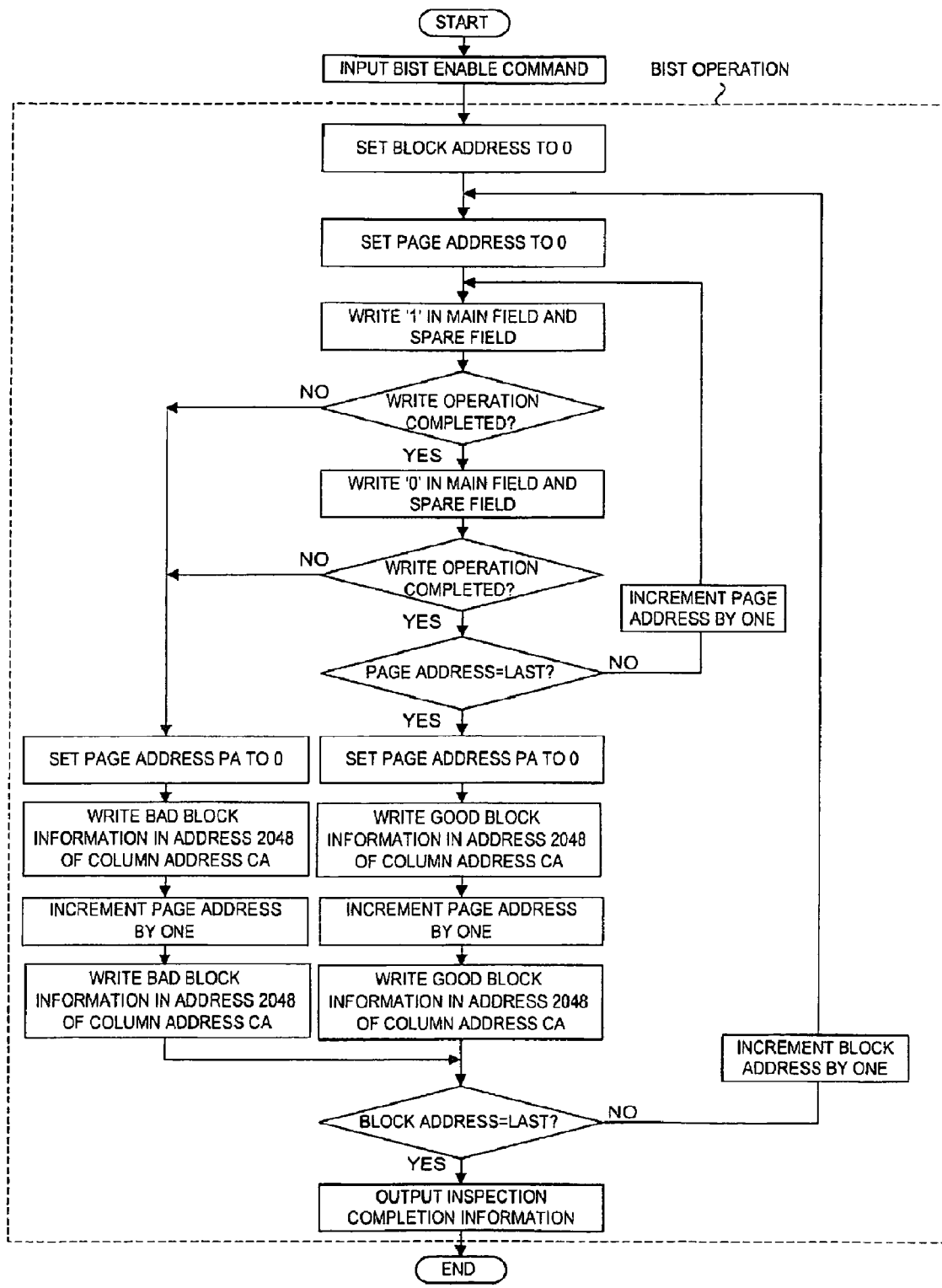
FIG. 27 is a view showing another example of the inspection and the block information writing sequence of the non-volatile memory constituted of the memory array shown in FIG. 1 in the manufacturing method of a phase change memory module according to the seventh embodiment of the present invention.

FIG. 27 shows a sequence of the phase change memory inspection and the block information writing in the present embodiment. When an enable command of the built-in self-test circuit BIST is inputted, the built-in self-test circuit BIST is started, and the sequence shown in FIG. 25 is executed inside the chip. When the operation check of the memory array and the writing of the block information are executed up to the last block, inspection completion information is outputted.

By the configuration of the phase change memory as described above, the manufacturing process shown in FIG. 23 can be easily realized. More specifically, since the operation check of the memory array and the writing of the block information are performed by the built-in self-test circuit BIST, the module vendor is required to have a specific testing device. Hence, the facility investment of the module vendor can be suppressed. Further, since the inspection by the built-in self-test circuit BIST can reduce the exchange of signals between the devices, a test time can be shortened. Therefore, the manufacturing cost of the phase change memory module can be suppressed.

Eighth Embodiment

Figure 28:
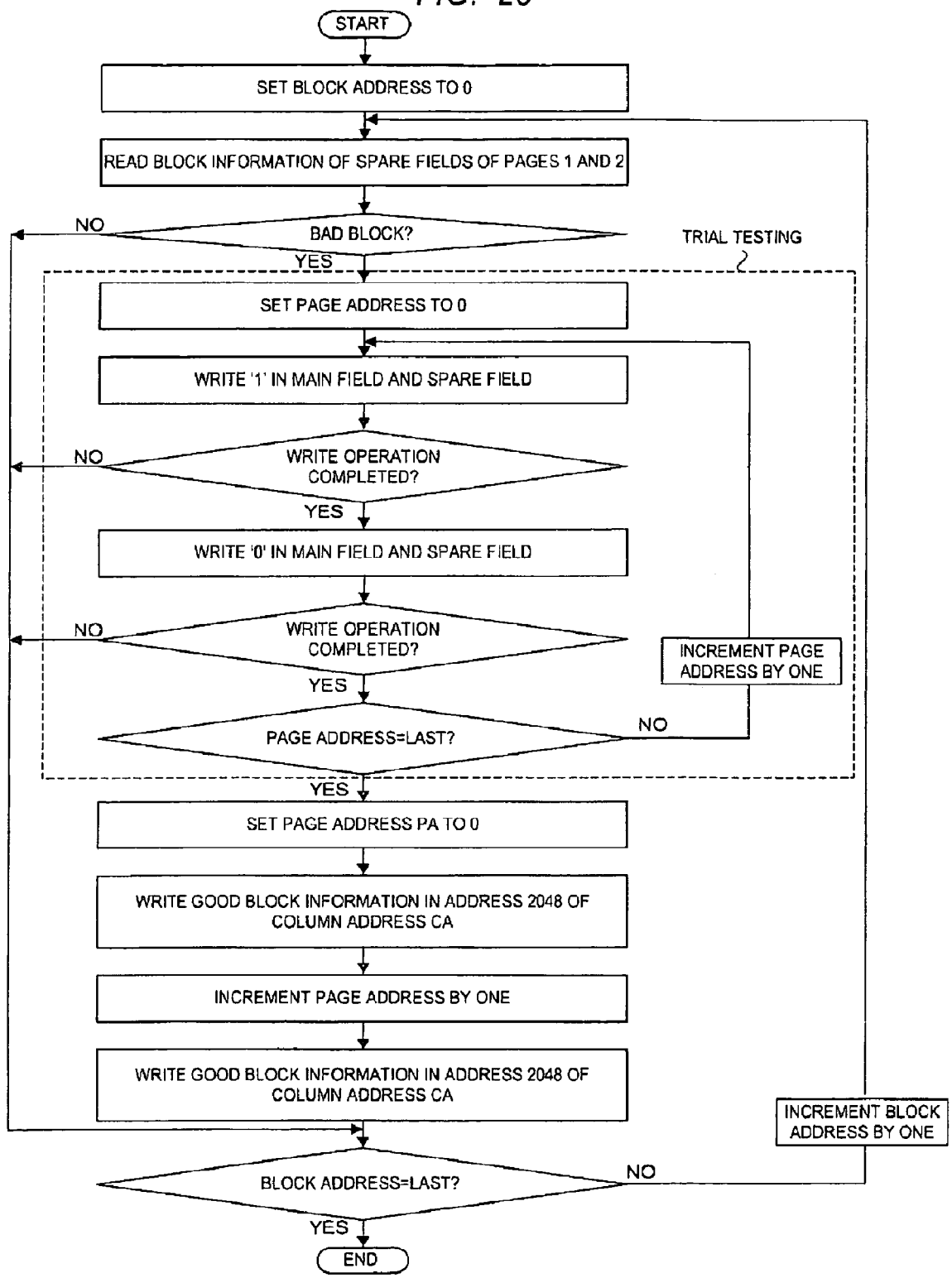
FIG. 28 is a view showing an example of the inspection sequence in an end user of the non-volatile memory constituted of the memory array shown in FIG. 1 in the manufacturing method of a phase change memory module according to the eighth embodiment of the present invention.

In the eighth embodiment, the inspection sequence in the end user who operates the device in which the phase change memory is built will be described. FIG. 28 shows the inspection sequence thereof. This inspection sequence conforms to the sequence shown in FIG. 25, and its feature is that the inspection of the bad block field is selectively performed and the block in which the defect bit is not detected is validated, in other words, the good block information is written in this block.

The above-described inspection is executed at the time of the power supply input of the system having the phase change memory module mounted thereon or periodically executed by using a timer. Depending on the application, the inspection is forcibly executed by inputting an external command. By such an operation sequence, it is expected that an electric signal is applied to the memory cell determined to be the defect bit at the time of manufacturing the module, thereby improving its performance. More specifically, by detecting and validating the memory cell with improved performance by a so-called "trial testing", the good block can be newly provided. In other words, effective utilization of the memory cell becomes possible.

In the foregoing, the invention made by the inventors of the present invention has been concretely described based on the embodiments. However, it is needless to say that the present invention is not limited to the foregoing embodiments and various modifications and alterations can be made within the scope of the present invention. For example, by combining a plurality of embodiments, a variety of effects can be obtained at the same time. Further, for example, though the phase change memory using a chalcogenide material is assumed as the storage element, the material of the storage element is not limited to the chalcogenide material, and the present invention can be generally applied to the non-volatile memory whose storage information is likely to be lost due to the thermal load in the manufacturing process. Further, the thermal load is not limited to that caused by the reflow soldering, and the present invention can exert the same effect for the thermal load other than the reflow soldering, for example, the thermal load to the IC card in the process of pressure bonding.

What is claimed is:

1. A non-volatile memory module comprising:
   a phase change memory having a plurality of memory cells each including a resistive storage device using a phase change material; and
   a control circuit which controls information written into the memory cells,
   wherein the phase change memory has a plurality of blocks each having a plurality of pages including a main field which stores storage information and a spare field which stores block information indicating a validity of a corresponding one of the blocks, and
   wherein if the block information indicates that block is invalid, the control circuit executes to write data '1' and data '0' into all of the main field and the spare field included in that block as a trial testing, and if the trial testing is successful, the control circuit writes the block information indicating that that block is valid into the spare field included in that block.

2. The non-volatile memory module according to claim 1, wherein the control circuit comprises a timer, and
   wherein the trial testing is executed periodically by using the timer.

3. The non-volatile memory module according to claim 1, wherein the trial testing is executed when a power supply is inputted into the non-volatile memory module.

4. The non-volatile memory module according to claim 1, wherein the trial testing is executed when the control circuit receives an external command from outside of the non-volatile memory module.

* * * * *